(12) United States Patent
Grumbine et al.

(10) Patent No.: US 9,422,456 B2
(45) Date of Patent: *Aug. 23, 2016

(54) COLLOIDAL SILICA CHEMICAL-MECHANICAL POLISHING COMPOSITION

(71) Applicant: Cabot Microelectronics Corporation, Aurora, IL (US)

(72) Inventors: Steven Grumbine, Aurora, IL (US); Jeffrey Dysard, St. Charles, IL (US); Ernest Shen, Naperville, IL (US); Mary Cavanaugh, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/749,923

(22) Filed: Jun. 25, 2015

(65) Prior Publication Data
US 2015/0376458 A1    Dec. 31, 2015

Related U.S. Application Data

(60) Provisional application No. 62/017,100, filed on Jun. 25, 2014.

(51) Int. Cl.
| | |
|---|---|
| *C09G 1/02* | (2006.01) |
| *B24B 1/00* | (2006.01) |
| *C09G 1/00* | (2006.01) |
| *C09G 1/04* | (2006.01) |
| *C09K 3/14* | (2006.01) |
| *H01L 21/306* | (2006.01) |
| *H01L 21/321* | (2006.01) |
| *H01L 21/3105* | (2006.01) |

(52) U.S. Cl.
CPC ... *C09G 1/02* (2013.01); *B24B 1/00* (2013.01); *C09G 1/00* (2013.01); *C09G 1/04* (2013.01); *C09K 3/1454* (2013.01); *C09K 3/1463* (2013.01); *H01L 21/30625* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,230,833 | A | 7/1993 | Romberger et al. |
| 5,958,288 | A | 9/1999 | Mueller et al. |

(Continued)

FOREIGN PATENT DOCUMENTS

| | | |
|---|---|---|
| JP | 2011-216582 A | 10/2011 |
| JP | 2013-227182 A | 11/2013 |

(Continued)

OTHER PUBLICATIONS

Korean Intellectual Property Office, International Search Report in International Patent Application No. PCT/US2015/037772 (Aug. 26, 2015).

(Continued)

*Primary Examiner* — Jiong-Ping Lu
(74) *Attorney, Agent, or Firm* — Thomas Omholt; Arlene Hornilla

(57) ABSTRACT

A chemical-mechanical polishing composition includes colloidal silica abrasive particles dispersed in a liquid carrier having a pH in a range from about 1.5 to about 7. The colloidal silica abrasive particles include an aminosilane compound or a phosphonium silane compound incorporated therein. The composition may be used to polish a substrate including a silicon oxygen material such as TEOS.

44 Claims, 1 Drawing Sheet

(56) References Cited

U.S. PATENT DOCUMENTS

| | | |
|---|---|---|
| 5,980,775 A | 11/1999 | Grumbine et al. |
| 6,117,783 A | 9/2000 | Small et al. |
| 6,776,810 B1 | 8/2004 | Cherian et al. |
| 7,029,508 B2 | 4/2006 | Scott et al. |
| 7,077,880 B2 | 7/2006 | Siddiqui |
| 7,994,057 B2 | 8/2011 | Dysard et al. |
| 8,252,687 B2 | 8/2012 | Li et al. |
| 8,372,999 B2 | 2/2013 | Holland et al. |
| 8,529,787 B2 | 9/2013 | Higuchi et al. |
| 8,840,798 B2 | 9/2014 | Han et al. |
| 2003/0209522 A1 | 11/2003 | Grumbine et al. |
| 2005/0079718 A1 | 4/2005 | Siddiqui et al. |
| 2007/0282122 A1 | 12/2007 | Holland et al. |
| 2009/0081871 A1 | 3/2009 | Dysard et al. |
| 2009/0081927 A1* | 3/2009 | Grumbine ............ B24B 37/044 451/36 |
| 2011/0163262 A1 | 7/2011 | Higuchi et al. |

FOREIGN PATENT DOCUMENTS

| | | |
|---|---|---|
| KR | 10-1243331 B1 | 3/2013 |
| KR | 10-2013-0074492 A | 7/2013 |

OTHER PUBLICATIONS

Korean Intellectual Property Office, International Search Report in International Patent Application No. PCT/US2015/037767 (Aug. 26, 2015).

Korean Intellectual Property Office, International Search Report in International Patent Application No. PCT/US2015/037741 (Aug. 26, 2015).

Korean Intellectual Property Office, International Search Report in International Patent Application No. PCT/US2015/037746 (Aug. 31, 2015).

Korean Intellectual Property Office, International Search Report in International Patent Application No. PCT/US2015/037733 (Sep. 30, 2015).

Korean Intellectual Property Office, International Search Report in International Patent Application No. PCT/US2015/037760 (Sep. 30, 2015).

* cited by examiner

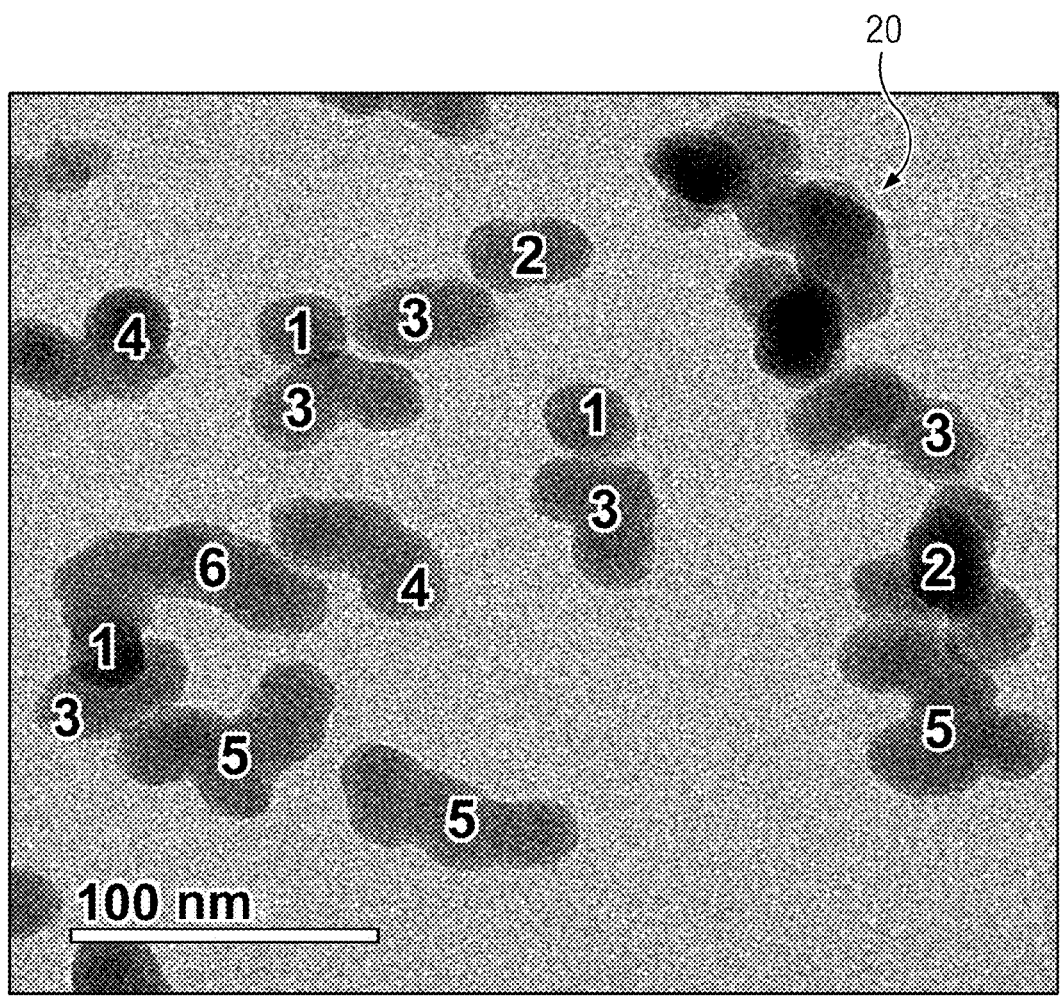

COLLOIDAL SILICA CHEMICAL-MECHANICAL POLISHING COMPOSITION

RELATED APPLICATION

This application claims the benefit of U.S. Provisional Application No. 62/017,100 entitled Colloidal Silica Abrasive for a Chemical Mechanical Polishing Composition, filed Jun. 25, 2014.

BACKGROUND OF THE INVENTION

A number of chemical-mechanical polishing (CMP) operations are used in both front-end-of-the-line (FEOL) and back-end-of-the-line (BEOL) processing of semiconductor devices. For example, the following CMP operations are commonly employed. Shallow trench isolation (STI) is an FEOL process used prior to formation of the transistors. A dielectric such as tetraethyl orthosilicate (TEOS) is deposited in openings formed in the silicon wafer. A CMP process is then used to remove the excess TEOS resulting in a structure in which a predetermined pattern of TEOS is inlaid in the silicon wafer. Tungsten plug and interconnect and copper interconnect and dual damascene processes are BEOL processes used to form the network of metal wires that connect the device transistors. In these processes tungsten or copper metal is deposited in openings formed in a dielectric material (e.g., TEOS). CMP processes are used to remove the excess tungsten or copper from the dielectric to form tungsten or copper plugs and/or interconnects therein. An interlayer dielectric (ILD) material (such as TEOS) is deposited between metal interconnect levels to provide electrical insulation between the levels. An ILD CMP step is commonly employed to smooth and planarize the deposited insulating material prior to building up the subsequent interconnect level.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. A chemical-mechanical polishing composition is generally applied to the surface of the pad while the substrate and pad are moved relative to one another. The relative motion of the substrate and pad (and the applied polishing composition) abrades and removes a portion of the material from the surface of the substrate, thereby polishing the substrate. Polishing of the substrate is generally aided by the chemical activity of the polishing composition (e.g., by a chemical accelerator) and/or the mechanical activity of an abrasive suspended in the polishing composition.

Chemical-mechanical polishing compositions and methods for polishing (or planarizing) the surface of a substrate are well known in the art. Polishing compositions (also known as slurries) for polishing dielectrics commonly include silica or ceria abrasives. Those utilizing silica abrasives commonly have a high pH and a high silica concentration (e.g., greater than 12 weight percent). Polishing compositions for polishing metal layers (such as tungsten or copper) commonly include silica or alumina abrasives as well as various chemical accelerators, such as oxidizers, chelating agents, catalysts, and the like.

As is well known in the art, the semiconductor industry is subject to continuing and severe downward pricing pressure. In order to maintain economically favorable CMP processes, high throughput is required thereby necessitating high removal rates of the primary material being polished (e.g., an ILD CMP process may require a high removal rate of TEOS while a tungsten CMP process may require a high removal rate of tungsten). The downward pricing pressure also extends to the CMP consumables themselves (e.g., to the CMP slurries and pads). Such pricing pressure poses a challenge to the slurry formulator as the pressure to reduce costs often conflicts with the desired slurry performance metrics. There is a real need in the industry for CMP slurries that provide high throughput at reduced overall costs.

BRIEF SUMMARY OF THE INVENTION

A chemical-mechanical polishing composition is disclosed for polishing a semiconductor substrate. The substrate may include a silicon oxygen material (e.g., an ILD layer on a semiconductor wafer). In one embodiment, the composition includes a water based liquid carrier, colloidal silica abrasive particles dispersed in the liquid carrier, and an aminosilane compound or a phosphonium silane compound incorporated in the colloidal silica abrasive particles internal to an outer surface thereof. The pH of this embodiment may be in a range from about 1.5 to about 7.

BRIEF DESCRIPTION OF THE FIGURE

For a more complete understanding of the disclosed subject matter, and advantages thereof, reference is now made to the following descriptions taken in conjunction with the accompanying FIGURE which depicts a transmission electron micrograph (TEM) of example colloidal silica particles having a distribution of aggregates.

DETAILED DESCRIPTION OF THE INVENTION

A chemical-mechanical polishing composition is disclosed. The composition includes a water based liquid carrier and colloidal silica abrasive particles dispersed in the liquid carrier. A chemical species such as an aminosilane compound is incorporated in the colloidal silica abrasive particles such that the particles preferably have a permanent positive charge. As is described in more detail below, the colloidal silica abrasive particles may be grown in a liquid solution containing the chemical species (e.g., the aminosilane compound) such that the chemical species become incorporated into the colloidal silica particles during growth thereof.

Methods for chemical-mechanical polishing a substrate using the above described chemical-mechanical composition are further disclosed. For example, a method for polishing a substrate including a silicon oxygen material may include contacting the substrate with the polishing composition, moving the polishing composition relative to the substrate, and abrading the substrate to remove a portion of the silicon oxygen material from the substrate and thereby polish the substrate. It will be understood that a silicon oxygen material is a material including silicon and oxygen, for example, including silicon oxides such as silicon dioxide (or others listed below).

The disclosed chemical-mechanical composition contains a dispersion of abrasive colloidal silica particles suspended in a liquid carrier (e.g., water). As used herein the term colloidal silica particles refers to silica particles that are prepared via a wet process rather than a pyrogenic or flame hydrolysis process which produces structurally different particles. A suitable dispersion may include both aggregated and non-aggregated colloidal silica particles. As is known to those of ordinary skill in the art, non-aggregated particles are individually discrete particles that may be spherical or nearly spherical in shape, but can have other shapes as well. These non-aggregated particles are referred to as primary particles. Aggregated particles are particles in which multiple discrete particles (primary particles) have clustered or bonded together to form aggregates having generally irregular shapes. Aggregated particles may include two, three, or more connected primary particles.

As described above the colloidal silica abrasive particles include a chemical species incorporated into the particles (i.e., in the interior of the particles). The chemical species is a nitrogen-containing compound or a phosphorus-containing compound. When the chemical species is a nitrogen-containing compound it preferably includes an amine containing compound or an ammonium containing compound. When the chemical species is a phosphorus-containing compound it preferably includes a phosphine containing compound or phosphonium containing compound. An ammonium compound may include $R^1R^2R^3R^4N^+$ and a phosphonium compound may include $R^1R^2R^3R^4P^+$, where $R^1$, $R^2$, $R^3$, and $R^4$ represent independently hydrogen, $C_1$-$C_6$ alkyl, a $C_7$-$C_{12}$ arylalkyl, or a $C_6$-$C_{10}$ aryl. These groups can, of course, be further substituted with one or more hydroxyl groups.

Example ammonium compounds may include tetramethylammonium, tetraethylammonium, tetrapropylammonium, tetrabutylammonium, tetrapentylammonium, ethyltrimethylammonium, and diethyldimethylammonium. In certain embodiments, the ammonium compound is preferably not ammonia or ammonium ($NH_3$ or $NH_4^+$).

Example phosphonium compounds may include tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium. Example phosphonium compounds may also include a phosphonium silane compound.

A nitrogen-containing compound may also include a substance having an amino group such as a primary amine, a secondary amine, a tertiary amine, or a quaternary amine compound. Such a nitrogen-containing compound may include an amino acid, for example, an amino acid having from one to eight carbon atoms such as lycine, glutamine, glycine, iminodiacetic acid, alanine, valine, leucine, isoleucine, serine, and threonine.

In certain embodiments, the chemical species may include a nitrogen-containing alkali catalyst, preferably having from 1 to 6 carbon atoms. Suitable compounds may include, for example, ethylenediamine, tetramethylammonium hydroxide (TMAH), or ethyloxypropylamine (EOPA).

In various embodiments, a molar ratio of the chemical species to silica in the colloidal silica abrasive particles is preferably greater than about 0.1 percent (e.g., greater than about 0.2 percent or greater than about 0.3 percent) and less than about 10 percent (e.g., less than 5 percent or less than 2 percent) or in a range from about 0.1 percent to about 10 percent (e.g., from about 0.2 percent to about 5 percent, from about 0.2 percent to about 2 percent, or from about 0.3 percent to about 2 percent). The nitrogen level of the colloidal silica abrasive particles may also be greater than about 0.15 mm/g $SiO_2$ (e.g., greater than about 0.2 mm/g $SiO_2$).

Aminosilane compounds are the most preferred nitrogen-containing compound. Such aminosilane compounds may include primary aminosilanes, secondary aminosilanes, tertiary aminosilanes, quaternary aminosilanes, and multi-podal (e.g., dipodal) aminosilanes. The aminosilane compound may include substantially any suitable aminosilane, for example, a propyl group containing aminosilane, or an aminosilane compound including a propyl amine. Examples of suitable aminosilanes may include bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl)propyl)-ethylenediamine, bis (trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, (N-trialkoxysilylpropyl) polyethyleneimine, trialkoxysilylpropyldiethylenetriamine, N-phenyl-3-aminopropyltrialkoxysilane, N-(vinylbenzyl)-2-aminoethyl-3-aminopropyltrialkoxysilane, 4-aminobutyltrialkoxysilane, and mixtures thereof. Those of ordinary skill in the art will readily appreciate that aminosilane compounds are commonly hydrolyzed (or partially hydrolyzed) in an aqueous medium. Thus by reciting an aminosilane compound, it will be understood that the aminosilane and/or a hydrolyzed (or partially hydrolyzed) species and/or condensed species thereof may be incorporated in the colloidal silica abrasive particles.

In embodiments in which the nitrogen-containing compound is an aminosilane compound, a molar ratio of the aminosilane compound to silica in the colloidal silica abrasive particles is preferably less than about 10% (e.g., less than about 8%, less than about 6%, less than about 5%, less than about 4%, or less than about 2%). The molar ratio is also preferably (although not necessarily) greater than about 0.1% (e.g., greater than about 0.2% or greater than about 0.3%). It will be understood that the molar ratio of the aminosilane compound to silica in the colloidal silica abrasive particles may be approximately equal to the molar ratio of the aminosilane compound to the silica producing compound in the liquid solution in which the colloidal silica abrasive particles are grown.

It will be understood that the colloidal silica abrasive particles may include two or more of the above described chemical species incorporated in the particles. For example, in one colloidal silica embodiment, a first incorporated chemical species may include an aminosilane compound and a second incorporated chemical species may include an ammonium compound, such as a quaternary amine. In an embodiment in which the first chemical species is ammonium and the second chemical species is a quaternary amine, a molar ratio of the first chemical species to the second chemical species is preferably less than about 5 to 1.

CMP compositions including positively charged colloidal silica abrasive particles have been disclosed, for example, in U.S. Pat. Nos. 7,994,057 and 8,252,687. In these patents, the positive charge on the silica particles was achieved via treating an external surface of the particles with a positively charged chemical compound such as a quaternary amine containing compound or an aminosilane containing compound. While certain benefits may be achieved when utilizing CMP compositions including such positively charged silica abrasive particles, the use of a surface treating agent may mask (or shield) the particle surface (e.g., the silanol and/or siloxane groups on the surface) such that the abrasive may not always have some of the same desirable properties as an untreated silica abrasive. For example, surface treatment may adversely affect the shelf life of the composition and the ability to concentrate the composition. Moreover, the use of surface treatment compounds may pose a challenge for post-CMP wafer cleaning operations.

One aspect of the invention is the realization that positively charged colloidal silica abrasive particles may alternatively be obtained via incorporating certain positively charged chemical species into the abrasive particles (i.e., incorporating the chemical species sub-surface in the interior of the particles). Colloidal silica abrasive particles having an internal chemical species that provides a positive charge may be fabricated, for example, via growing the abrasive particles in a liquid solution containing the chemical species such that the chemical species become incorporated into at least a portion of the colloidal silica particles during growth thereof. Such abrasive particles may alternatively be fabricated via treating a conventional colloidal silica particle with the chemical species and then growing additional silica over the chemical species (and thereby covering the chemical species with additional silica). While the chemical species is incorporated internally in the colloidal silica abrasive particles, it will be understood that a portion of the chemical species may be at or near the particle surface (such that the chemical species is both internal to the surface and at the surface).

In a first embodiment, colloidal silica abrasive particles having an internal chemical species may be fabricated, for example, via (i) providing a liquid solution (e.g., including water at a predetermined pH) and (ii) combining the liquid solution with the silica producing compound and the chemical species thereby causing colloidal silica particles to grow in the liquid solution such that a dispersion is obtained including colloidal silica particles having the chemical species incorporated therein. The chemical species may alternatively be included in the liquid solution provided in (i). The silica producing compound may include, for example, tetramethyl orthosilicate (TMOS), tetraethyl orthosilicate (TEOS), silicic acid, an alkali or ammonium silicate, or a silicon tetrahalide. This methodology is similar to that disclosed in U.S. Pat. No. 8,529,787 in which TMOS is continuously added to a mother liquid including an alkali catalyst (the similarity is that a silica producing compound is combined with a liquid solution to produce colloidal silica particles).

The method may further include processing the dispersion to obtain a chemical-mechanical polishing composition including the colloidal silica particles with the chemical species incorporated therein. The processing may include, for example, diluting the dispersion with water and/or distilling the dispersion to remove methanol or ethanol bi-products obtained during growth of the colloidal silica particles. The processing may alternatively and/or additionally include adjusting the pH to a desired value and/or adding other chemical components such as an oxidizer, an accelerator, a catalyst, a buffer, a chelating agent, a corrosion inhibitor, a film forming agent, a surfactant, a polishing uniformity additive, a biocide, and the like. The processing does not include a high temperature calcination step that would burn off (or otherwise remove) the chemical species from the colloidal silica particles, as it is desirable for the chemical species to remain in the colloidal silica particles.

The chemical species dissolved in the aqueous liquid solution may include any one or more of the species described above, but most preferably includes an aminosilane compound. The chemical species may be added to the liquid solution in substantially any suitable amount such that a sufficient amount is incorporated into the colloidal silica particles (with the particles preferably—although not necessarily—including less than 10 weight percent of the chemical species incorporated therein). The aqueous liquid solution may further optionally include an alkali catalyst, for example, including an ether amine, an ethylene amine, a tetraalkyl amine, and/or an alcohol amine. Suitable alkali catalysts may include an organic base catalyst such as ethylenediamine, diethylenetriamine, triethylenetetramine, ammonia, urea, monoethanolamine, diethanolamine, triethanolamine, tetramethylammonium hydroxide (TMAH), tetramethylguanidine, tetraethylammonium hydroxide, aminopropylmorpholine, hexyloxypropylamine, ethyloxypropylamine (EOPA), jeffamine HK-511, or combinations thereof. In certain embodiments, the alkali catalyst may preferably have from 1 to 6 carbon atoms. The alkali catalyst may alternatively and/or additionally include potassium hydroxide (KOH). The amount of alkali catalyst added may be selected so that the pH of the aqueous liquid solution is generally in the range from about 7 to about 14 and preferably in the range from about 9 to about 12.

The liquid solution may optionally further include colloidal silica particles that are intended to act as nucleation sites for growth of the colloidal silica. In such embodiments, the final colloidal silica may be thought of as having a core-shell structure (or a multi-layer structure) in which the core (the inner layer) includes the colloidal silica particles originally added to the liquid solution and the shell (the outer layer) includes the silica that is grown over the core and includes an internal chemical species (such as an aminosilane). In particles having a core-shell structure, the shell may have substantially any suitable thickness, for example, greater than 1 nm (e.g., greater than 2 nm, greater than 3 nm, or greater than 5 nm). It will be understood that the disclosed embodiments are not limited colloidal silica particles having a core-shell structure as the internal chemical species (e.g., the aminosilane) may be distributed throughout substantially the entire particle.

In a second embodiment, colloidal silica abrasive particles having an internal chemical species may be fabricated, for example, via (i) providing a high pH silicate solution (e.g., a sodium silicate or potassium silicate solution), (ii) processing the silicate solution to protonate the silicate anions and form silicic acid (e.g., via adding an acid to the solution or passing the solution through an ion exchange column) which in turn causes precipitation and growth of colloidal silica particles in a reaction vessel, and (iii) adding the chemical species to the reaction vessel such that it becomes incorporated into the growing colloidal silica particles. The silicate solution preferably has a pH in the range from about 11 to about 13. The silicate solution may be passed through an ion exchange column into the reaction vessel which tends to lower the pH to a value in a range from about 2 to about 5. The chemical species may be added to the reaction vessel in substantially any suitable amount (and at substantially any suitable rate) such that a sufficient amount is incorporated into the colloidal silica particles (with the particles preferably—although not necessarily—including less than 10 weight percent of the chemical species incorporated therein).

In a third embodiment, colloidal silica abrasive particles may be fabricated, for example, via treating (e.g., surface treating) a conventional colloidal silica particle with a chemical species and then growing additional silica over the treated colloidal silica (i.e., over the chemical species). For example, a nitrogen-containing compound such as a quaternary amine compound or an aminosilane compound may be added to a colloidal silica containing dispersion (e.g., as taught in U.S. Pat. Nos. 7,994,057 and 8,252,687). After sufficient time to allow the nitrogen compound to become associated (e.g., chemically bonded or electrostatically associated) with the colloidal silica particles, a silica producing compound such as TMOS, TEOS, silicic acid, an alkali or ammonium silicate, or a silica tetrahalide may be added to the dispersion. The dispersion may be optionally heated (e.g., to 45 degrees C.) to accelerate further growth of the colloidal silica particles such that the chemical species (the surface treatment agent) becomes incorporated into the particle. Such colloidal silica particles may be thought of as having at least two layers, a first inner layer including the treated colloidal silica and a second outer layer of silica deposited over the inner layer thereby incorporating the chemical species in the particle.

Positively charged colloidal silica abrasive particles may alternatively be obtained via incorporating a positively charged chemical species into the abrasive particles and then further bonding (via surface treating) the same or a different chemical species to the particle surface. Such abrasive particles may be fabricated, for example, by first growing the colloidal silica particles in a liquid solution containing the chemical species (e.g., using one of the methodologies described above) such that the chemical species becomes incorporated into at least a portion of the colloidal silica particles during growth thereof and then subsequently surface treating the particles. For example, in one embodiment the colloidal silica abrasive particles may include an internal chemical species including a nitrogen-containing alkali catalyst having from 1 to 6 carbon atoms (such as the aforementioned ethylenediamine, TMAH, or EOPA). The abrasive particles may then further be surface treated, for example, with an aminosilane compound. Such colloidal silica abrasive particles may advantageously achieve high charge levels using very low surface treatment levels of the aminosilane (and thereby potentially masking a smaller percentage of the silanol and/or siloxane groups on the surface).

In embodiments in which the colloidal silica abrasive particles include an internal nitrogen-containing alkali catalyst having from 1 to 6 carbon atoms and are further surface treated with an aminosilane compound, the colloidal silica abrasive particles may include a low level of the internal chemical species, for example, less than 0.20 mmol/g of nitrogen. In such embodiments the zeta potential of the particles prior to the surface treatment may be less than 15 mV (e.g., less than 13 mV or less than 10 mV) at a pH of 4. Likewise, the colloidal silica abrasive particles may include a low level of the aminosilane compound bonded to the surface, for example, to less than 4% (e.g., less than 3%, or less than or equal to 2%) of the silanol groups on the surface (assuming 4.5 SiOH per $nm^2$ and the BET surface area of the silica).

It will be understood that the above described methodologies for fabricating colloidal silica particles having an internal chemical species result in a dispersion in which the colloidal silica particles are suspended in a liquid carrier. In fabricating the chemical-mechanical polishing compositions described herein, the dispersion may be diluted to a predetermined concentration of colloidal silica particles. Moreover, other chemical compounds may be added to the dispersion (before or after dilution) as desired. Such chemical compounds may include substantially any of the compounds disclosed herein.

The colloidal silica particle may have substantially any suitable degree of aggregation. For example, the colloidal silica abrasive may be substantially non-aggregated in that it includes mostly primary particles. Alternatively, the colloidal silica abrasive may be partially aggregated. By partially aggregated it may be meant that 50 percent or more of the colloidal silica abrasive particles include two or more aggregated primary particles or that 30 percent or more (or 45 percent or more) of the colloidal silica particles include three or more aggregated primary particles. Such partially aggregated colloidal silica abrasives may be prepared, for example, using a multi-step process in which primary particles are first grown in solution, for example as described in U.S. Pat. No. 5,230,833. The pH of the solution may then be adjusted to an acidic value for a predetermined time period to promote aggregation (or partial aggregation), for example, as described in U.S. Pat. No. 8,529,787. An optional final step may allow for further growth of the aggregates (and any remaining primary particles).

The colloidal silica abrasive particles may further have an aggregate distribution in which 20 percent or more of the colloidal silica abrasive particles include less than three primary particles (i.e., non-aggregated primary particles or aggregated particles having just two primary particles, also referred to as monomers and dimers) and 50 percent or more of the colloidal silica abrasive particles include three or more aggregated primary particles.

The FIGURE depicts a transmission electron micrograph (TEM) of example colloidal silica particles having the above described aggregate distribution for a CMP composition. The example TEM depicts colloidal silica particles having from one to six primary particles. A total of 16 particles were counted, three of which consisted of a single primary particle, two of which consisted of two aggregated primary particles, five of which consisted of three aggregated primary particles, two of which consisted of four aggregated primary particles, three of which consisted of five aggregated primary particles, and one of which consisted of six aggregated primary particles. The depicted image also includes what appears to be a large particle in the upper right (depicted at 20) that was not counted as it was unclear from the image whether this feature was a single aggregate or multiple aggregates lying in close proximity to one another. Given the relatively small number of particles in any one image, it will be understood that in order to obtain a statistically significant measure of the aggregate distribution, it is generally necessary to evaluate a large number of TEM images.

Colloidal silica abrasive particles having an aggregate distribution as described herein may be grown, for example, as described above with respect to U.S. Pat. Nos. 5,230,833 and 8,529,787. Alternatively, colloidal silica abrasive particles having an aggregate distribution (as defined above) may be prepared by adding primary particles to a partially aggregated or aggregated colloidal silica. For example, primary colloidal silica particles may be added to a dispersion having partially aggregated colloidal silica particles in which 50 percent or more of the colloidal silica abrasive particles include three or more aggregated primary particles such that 5 percent or more of the colloidal silica abrasive particles are primary particles. In such an embodiment, the aggregated colloidal silica particles may have a mean particle size in a range from about 40 to about 60 nm while the primary colloidal silica particles may have a mean particle size in a range from about 15 to about 35 nm. Moreover, the polishing composition may include from about 1 to about 4 weight percent of the aggregated colloidal silica particles and from about 0.05 to about 0.5 weight percent of the primary colloidal silica particles that are not aggregated.

The particle size of a particle suspended in a dispersion may be defined in the industry using various means. In the embodiments disclosed herein, the particle size is defined as measured by the Zetasizer® available from Malvern Instruments®. The abrasive particles may have substantially any particle size suitable for the particular CMP operation. The abrasive particles preferably have an average particle size of about 10 nm or more (e.g., about 20 nm or more, about 30 nm or more, or about 40 nm or more). The abrasive particles preferably also have an average particle size of about 100 nm or less (e.g., about 80 nm or less, about 70 nm or less, or about 60 nm or less). Accordingly, the abrasive particles may have an average particle size in a range from about 10 nm to about 100 nm (e.g., from about 20 nm to about 80 nm, or from about 30 to about 70, or from about 40 to about 60).

The colloidal silica abrasive particles may further have substantially any suitable primary particle size. In certain embodiments, the primary particle size may be in a range from about 15 to about 35 nm (e.g., from about 20 to about 30 nm). Moreover, it may be advantageous for the primary particles to all have about the same size (such that the colloidal silica has a narrow primary particle size distribution). For example, greater than 90% (e.g., greater than 95%, greater than 98%, or greater than 99%) of the primary particles may have primary particle size in a range from about 15 to about 35 nm (e.g., from about 20 to about 30 nm). Furthermore, a standard deviation of the primary particle size may be less than about 5 nm.

The polishing composition may include substantially any suitable amount of colloidal silica particles, however, in general the point of use amount is desirably low so as to reduce the cost of the CMP operation. In one example CMP composition formulated for polishing a silicon oxygen material, the polishing composition may include about 0.1 wt. % or more of the colloidal silica abrasive particles (e.g., about 0.2 wt. % or more, about 0.5 wt. % or more, about 1 wt. % or more, or about 1.5 wt. % or more). The point of use polishing composition may include about 5 wt. % or less of the colloidal silica abrasive particles (e.g., about 4 wt. % or less, about 3 wt. % or less, or about 2.5 wt. % or less). Preferably, the amount of colloidal silica particles in the point of use polishing composition is in a range from about 0.1 wt. % to about 5 wt. %, and more preferably from about 0.5 wt. % to about 4 wt. % (e.g., from about 1 wt. % to about 3 wt. %). Polishing compositions having less than 2 wt. % (or even less than 1 wt. %) of the colloidal silica particles have surprisingly been found to be suitable for polishing silicon oxygen materials (particularly at a downforce of less than about 4 psi or even less than 3 psi).

The polishing composition of the invention may advantageously be provided as a chemical-mechanical polishing concentrate which is intended to be diluted with an appropriate amount of water prior to use. In such an embodiment, the concentrate may include more than 5 wt. % of the colloidal silica (e.g., more than about 8 wt. %, more than about 10 wt. %, or more than about 12 wt. %). The concentrate may also include less than about 25 wt. % of the colloidal silica (e.g., less than about 22 wt. %, less than about 20 wt. %, or less than about 18 wt. %). The concentrate preferably includes from about 5 to about 25 wt. % of the colloidal silica (e.g., from about 8 to about 22 wt. %, from about 10 to about 20 wt. %, or from about 12 to about 18 wt. %). In embodiments in which the polishing composition includes a silicon nitrogen (e.g., a silicon nitride) accelerator such as a poly-acid (as described in more detail below), the concentrate may include from about 5 to about 20 wt. % of the colloidal silica (e.g., from about 8 to about 15 wt. %).

Chemical-mechanical polishing concentrates are preferably colloidal stable (such that the mean colloidal silica particle size in the concentrate does not increase significantly with time). For example, in preferred concentrate embodiments, the mean particle size of the colloidal silica abrasive does not increase more 8 nm (e.g., not more than 5 nm, not more than 3 nm, or not more than 2 nm) when subject to an accelerating aging test (a heat treatment) at 45 degrees C. for 1 week.

The liquid carrier is used to facilitate the application of the abrasive and any optional chemical additives to the surface of a suitable substrate to be polished (e.g., planarized). The liquid carrier may be any suitable carrier (e.g., solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The colloidal silica abrasive particles may optionally have a permanent positive charge in the polishing composition. The charge on dispersed particles such as colloidal silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using the Model DT-1202 Acoustic and Electro-acoustic spectrometer available from Dispersion Technologies, Inc. (Bedford Hills, N.Y.).

The colloidal silica particles in the polishing composition preferably have a permanent positive charge of about 6 mV or more (e.g., about 8 mV or more, about 10 mV or more, about 13 mV or more, about 15 mV or more, or about 20 mV or more). The colloidal silica particles in the polishing composition may have a permanent positive charge of about 50 mV or less (e.g., about 45 mV or less, about 40 mV or less, or about 35 mV or less). Preferably, the colloidal silica particles have a permanent positive charge in a range from about 6 mV to about 50 mV (e.g., about 10 mV to about 45 mV, about 15 mV to about 40 mV, or about 20 mV to about 40 mV).

By permanent positive charge it is meant that the positive charge on the silica particles is not readily reversible, for example, via flushing, dilution, filtration, and the like. A permanent positive charge may be the result of incorporating the positive charged species in the particle. A permanent positive charge may further result from a covalent interaction between the particle and a positively charged species and is in contrast to a reversible positive charge that may be the result, for example, of an electrostatic interaction between the particle and a positively charged species.

Notwithstanding, as used herein, a permanent positive charge of at least 6 mV means that the zeta potential of the colloidal silica particles remains above 6 mV after the following three step filtration test. A volume of the polishing composition (e.g., 200 ml) is filtered through a Millipore Ultracell regenerated cellulose ultrafiltration disk (e.g., having a MW cutoff of 100,000 Daltons and a pore size of 6.3 nm). The remaining dispersion (the approximately 65 ml of dispersion that is retained by the ultrafiltration disk) is collected and replenished with pH adjusted deionized water. The deionized water is pH adjusted to the original pH of the polishing composition using a suitable inorganic acid such as nitric acid. This procedure is repeated for a total of three filtration cycles. The zeta-potential of the triply filtered and replenished polishing composition is then measured and compared with the zeta potential of the original polishing composition. This three step filtration test is further illustrated below by way of example (in Example 10).

While not wishing to be bound by theory, it is believed that the dispersion retained by the ultrafiltration disk (the retained dispersion) includes the silica particles and any chemical components (e.g., the positively charged species) that may be in the particles or associated with the surface of the particles (e.g., bonded, attached, electrostatically interacting, or in contact with the particle surface). At least a portion of the liquid carrier and the chemical components dissolved therein pass through the ultrafiltration disk. Replenishing the retained dispersion to the original volume is believed to upset the equilibrium in the original polishing composition such that the chemical components associated with the particle surface may tend towards a new equilibrium. Components that are in the particle or are strongly associated (e.g., covalently bonded) with the particle surface remain with the particle such that there tends to be little if any change in the positive zeta potential thereof. In contrast, a portion of components that have a weaker association (e.g., an electrostatic interaction) with the particle surface may return to the solution as the system tends towards the new equilibrium thereby resulting in a reduction in the positive zeta potential. Repeating this process for a total of three ultrafiltration and replenishing cycles is believed to amplify the above described effect.

It is preferred that there is little difference between the zeta potential of the colloidal silica particles in the original polishing composition and the colloidal silica particles in the polishing composition after the above described three step filtration test (after correcting for ionic strength differences resulting from the filtration test). For example, it is preferred that the zeta potential of the colloidal silica particles in the original polishing composition is less than about 10 mV greater than the zeta potential of the colloidal silica particles after the three step filtration test (e.g., less than about 7 mV greater, less than about 5 mV greater, or even less than about 2 mV greater). Stated another way it is preferred that the zeta potential of the colloidal silica particles after the three-step filtration test is less than 10 mV (or less than 7 mV, or less than 5 mV, or less than 2 mV less) less than the zeta potential of the colloidal silica particles in the original polishing composition. For example, in an embodiment in which the zeta potential of the colloidal silica particles in the original polishing composition is 30 mV, the zeta potential of the colloidal silica particles after the three-step filtration test is preferably greater than 20 mV (or greater than 23 mV, or greater than 25 mV, or greater than 28 mV).

The polishing composition may be acidic having a pH of less than about 7, e.g., in the range from about 1.5 to about 7. For polishing compositions used to polish silicon oxygen materials such as silicon dioxide and TEOS the pH is preferably about 3 or more (e.g., about 3.5 or more, or about 4 or more). Preferably, the polishing composition has a pH of about 6.5 or less (e.g., about 6 or less). More preferably, the polishing composition has a pH in a range from about 3 to about 7 (e.g., from about 3.5 to about 6.5). The pH range of the polishing composition is most preferably in a range from about 4 to about 6.

The pH of the polishing composition may be achieved and/or maintained by any suitable means. The polishing composition may include substantially any suitable pH adjusting agents and/or buffering agents. For example, suitable pH adjusting agents may include nitric acid, sulfuric acid, ammonium hydroxide, and the like. Suitable buffering agents may include phosphates, carboxylates, borates, amino acids and the like. In embodiments in which the pH is the range from about 3 to about 7, the buffering agents preferably have a pKa in range from 3.5 to about 5.5. Such buffering agents may include, for example, formic acid, glycolic acid, acrylic acid, 2-thiazolamine, melamine, propanoic acid and various propanoic acid containing compounds, glyceric acid, β-Alanine, trimethylamine, barbituric acid, butenoic acid and various botanic acid compounds, acetic acid, acetoacetic acid, uric acid, glutaric acid, aminophenol, and hydroxypyridine.

The chemical-mechanical polishing composition may optionally further include a uniformity additive for improving the within wafer uniformity of the polishing rate (e.g., a wafer edge to center polishing rate ratio or difference). The uniformity additive may include, for example, polyethers such as polyethylene glycol and polyether amine, polyalcohols such as ethylene glycol, propylene glycol, and polyvinyl alcohol, and/or amine containing compounds such as an aminophenol, a hydroxypyridine, and cetyl trimethylammonium bromide.

In certain chemical-mechanical polishing applications (e.g., shallow trench applications) a silicon oxygen material may be polished in combination with a silicon nitrogen material such as silicon nitride (SiN). In particular applications it may be desirable to achieve a high removal rate for both the silicon oxygen material and the silicon nitrogen material (e.g., such that a TEOS:SiN polishing rate selectivity is less than about 10:1). The chemical-mechanical polishing composition may therefore optionally further include a silicon nitrogen polishing accelerator. The silicon nitrogen polishing accelerator may include, for example, substantially any suitable poly acid such as polycarboxylic acids and/or poly phosphonic acids. Example polycarboxylic acids may include, for example, oxalic acid, citric acid, malonic acid, succinic acid, glutaric acid, adipic acid, tartaric acid, sulfosuccinic acid, and/or phthalic acid. It will be understood that such polycarboxylic acids may generally be used in their conjugate form, e.g., the carboxylate can be used instead of the carboxylic acid. For the purposes of this application the term "acid" as it is used to describe useful silicon nitrogen accelerators also means the conjugate base (or bases) of the acid.

Suitable poly phosphonic acids may include for example, methylene phosphonic acid compounds and diphosphonic acid compounds such as 1-hydroxyethylidene-1,1,-diphosphonic acid, amino tri(methylene phosphonic acid), diethylenetriamine penta(methylene phosphonic acid), and bis(hexamethylene triamine penta(methylenephosphonic acid)). It will be understood that such poly phosphonic acids may generally be used in their conjugate form, e.g., the phosphonate can be used instead of the phosphonic acid (as described above with respect to the carboxylic acids). Suitable examples of the above described poly phosphonic acid compounds are sold under the Dequest® trade name (Italmatch Chemicals, Genova, Italy).

In other applications, it may be desirable to achieve a high silicon oxygen polishing rate and a low silicon nitrogen polishing rate (e.g., to achieve a TEOS:SiN polishing rate selectivity of greater than about 20:1). The chemical-mechanical polishing composition may therefore optionally further include a silicon nitrogen polishing inhibitor. The silicon nitrogen polishing inhibitor may include, for example, a chemical compound having a ring and/or a nitrogen group. The inhibitor preferably includes a chemical compound in which the nitrogen is a member of the ring (such as a pyridine compound) or bonded to the ring. The silicon nitrogen inhibitor most preferably includes a hydroxy group bonded to the ring. Such compounds may include for example aminophenol compounds or hydroxy pyridine compounds.

Certain embodiments of the disclosed polishing compositions have been observed to achieve a higher silicon dioxide (TEOS) polishing rate when the electrical conductivity of the polishing composition is low. Example polishing compositions may therefore advantageously have an electrical conductivity of less than 1000 μS/cm (e.g., less than 800 μS/cm, less than 500 μS/cm, or less than 400 μS/cm, less than 300 μS/cm, less than about 200 μS/cm, less than about 150 μS/cm, or less than about 100 μS/cm).

In certain embodiments, the colloidal silica abrasive particles may advantageously have a density greater than about 1.90 grams/cm$^3$ (e.g., greater than about 2.0 grams/cm$^3$, greater than about 2.05 grams/cm$^3$, or even greater than about 2.0 grams/cm$^3$ for certain applications). The density may be measured using a pycnometer (such as a glass pycnometer), for example, as described in more detail below in Example 14.

The colloidal silica particles may optionally further be characterized as having a $^{29}$Si peak area measured by solid-state $^{29}$Si{$^1$H} cross-polarization coupled to magic angle spinning (CP-MAS) spectroscopy within a preferred range. The $^{29}$Si peak area is described in more detail with respect to Example 14. In one embodiment, the colloidal silica particles may have a have a $^{29}$Si peak area of greater than about 5 (e.g., greater than about 6, or greater than about 7). In alternative embodiments the $^{29}$Si peak area of the colloidal silica may be less than about 7 (e.g., less than about 6, or less than about 5).

The polishing composition may advantageously have a high purity. For example, the polishing composition may have a total metals impurity (in which the metals include potassium, sodium, iron, aluminum, calcium, magnesium, titanium, nickel, chromium, copper, and zinc) of less than 20 parts per million (e.g., less than 15 ppm, less than 10 ppm, less than 5 ppm, less than 2.5 ppm, or less than 1 ppm). The polishing composition may further have a total metals impurity (in which the metals include sodium, aluminum, calcium, magnesium, and the transition metals) of less than 20 parts per million (e.g., less than 15 ppm, less than 10 ppm, less than 5 ppm, less than 2.5 ppm, or less than 1 ppm).

The polishing composition may optionally further include a biocide. The biocide may include any suitable biocide, for example an isothiazolinone biocide. The amount of biocide in the polishing composition may be in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica abrasive particles, a pH adjusting agent, etc.). The colloidal silica abrasive particles may be grown in the aqueous liquid carrier, for example, as described above. This dispersion may then be diluted and the pH adjusted to a predetermined value, for example, via adding buffering agent. Other optional additives such as a uniformity additive and/or a biocide may also be added.

The polishing composition of the invention may advantageously be provided as a concentrate which is intended to be diluted with an appropriate amount of water prior to use. In such an embodiment, the polishing composition concentrate may include the colloidal silica abrasive particles having a positively charged species incorporated therein as described above and other optional additives in amounts such that, upon dilution of the concentrate with an appropriate amount of water each component of the polishing composition will be present in the polishing composition in an amount within the appropriate range recited above for each component. For example, the colloidal silica abrasive particles may be present in the polishing composition in an amount that is about 2 times (e.g., about 3 times, about 4 times, about 5 times, about 8 times, about 10 times, about 15 times, or even about 20 times) greater than the concentration recited above for each component so that when the concentrate is diluted with an equal volume of (e.g., 2 equal volumes of water, 3 equal volumes of water, 4 equal volumes of water, 7 equal volumes of water, 9 equal volumes of water, 14 equal volumes of water, or even 19 equal volumes of water respectively) each component will be present in the polishing composition in an amount within the ranges set forth above. Preferred polishing compositions are able to be concentrated by at least about 5 times. Furthermore, as will be understood by those of ordinary skill in the art, the concentrate may contain an appropriate fraction of the water present in the final polishing composition in order to ensure that other components are at least partially or fully dissolved in the concentrate.

In one embodiment, a suitable concentrate includes at least 10 weight percent of one of the above described colloidal silica abrasive particles dispersed in a water based liquid carrier (e.g., a colloidal silica including a nitrogen-containing compound such as an aminosilane compound or a phosphorus-containing compounds such as a phosphonium silane compound incorporated internal to an outer surface of the particles). The colloidal silica particles may optionally have a permanent positive charge of at least 8 mV. Moreover, the pH of the composition may be in a range from about 1.5 to about 7 and the electrical conductivity of the composition may optionally be less than 2000 μS/cm (e.g., less than about 1000 or less than about 500 μS/cm).

Although the polishing composition of the invention may be used to polish substantially any substrate, the disclosed polishing compositions are particularly useful in the polishing of a substrate comprising at least one silicon oxygen material, such as silica, TEOS, porous or non-porous carbon doped silicon oxide, fluorine-doped silicon oxide, or glass. The composition is particularly well suited for use in polishing silicon dioxide layers such as TEOS.

The conventional wisdom in the art has long been that the use of an alkaline composition is required in order to achieve suitably high removal rates of a silicon oxygen material (such as a TEOS ILD layer). For example, one well known text states that in order to achieve "maximum polish rates with silica slurry, the pH of the slurry should be in or near the range of 10.5-11.2. In this regime, the surface of the silicon dioxide film is strongly hydroxylated with internal bonds broken by interaction with the alkaline liquid" (M. R. Oliver, editor, *Chemical Mechanical Planarization of Semiconductor Materials*, Springer-Verlag, Berlin, 2004, p. 12). Conventional wisdom also dictates that a high concentration of silica abrasive particles is also required to achieve suitably high removal rates of a silicon oxygen material. The same text cited above (on page 234) demonstrates a sharp drop-off in silicon dioxide removal rate from 15 to 12 to 9 weight percent silica abrasive particles in a CMP slurry. Consistent with this observation, known commercially available CMP compositions intended for use in ILD CMP operations (such as Semi-Sperse® 25 available from Cabot Microelectronics Corporation and Klebosol® 1730 available from Dow Chemical Company) advertise a point of use silica abrasive concentration of 12.5 weight percent or higher.

In one disclosed embodiment, a method of chemical-mechanical polishing a silicon oxygen material such as TEOS makes use of one of the disclosed polishing compositions having a pH of less than 7 (e.g., in a range from 3 to 6) and including less than 3 (e.g., less than 2.5 or less than 2) weight percent colloidal silica abrasive particles. An average removal rate of the silicon oxygen material is greater than 3000 Å/min at a downforce of 5 psi during the CMP operation. An average removal rate of the silicon oxygen material may also be greater than 2000 Å/min at a downforce of 4 psi during the CMP operation. Such polishing rates may be achieved on wafers having substantially any suitable diameter, for example, on 200 mm diameter wafers, 300 mm diameter wafers, or 450 mm diameter wafers. In these methods a removal rate of a silicon nitride material may optionally be less than 300 Å/min at a downforce of 3 psi.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as the silicon oxygen material as described herein) to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

It will be understood that the disclosure includes numerous embodiments. These embodiments include, but are not limited to, the following embodiments.

In a first embodiment a chemical-mechanical polishing composition includes: a water based liquid carrier; colloidal silica abrasive particles dispersed in the liquid carrier; an aminosilane compound or a phosphonium silane compound incorporated in the colloidal silica abrasive particles internal to an outer surface thereof; and has a pH in a range from about 1.5 to about 7.

A second embodiment may include the first embodiment wherein the colloidal silica abrasive particles have a positive charge of at least 13 mV.

A third embodiment may include the first embodiment wherein the colloidal silica abrasive particles have a positive charge of at least 20 mV.

A fourth embodiment may include the first embodiment wherein the colloidal silica abrasive particles have a positive charge of at least 15 mV and less than 35 mV.

A fifth embodiment may include any one of the first through fourth embodiments having a pH in a range from about 3.5 to about 6.

A sixth embodiment may include any one of the first through fifth embodiments further comprising a buffering agent having a pKa in a range from about 3.5 to about 5.5.

A seventh embodiment may include any one of the first through sixth embodiments wherein the colloidal silica abrasive particles have a mean particle size in a range from about 30 to about 70 nm.

An eighth embodiment may include any one of the first through sixth embodiments wherein the colloidal silica abrasive particles have a mean particle size in a range from about 40 to about 60 nm.

A ninth embodiment may include any one of the first through eighth embodiments comprising from about 0.5 to about 4 weight percent of the colloidal silica abrasive particles.

A tenth embodiment may include any one of the first through eighth embodiments comprising less than about 3 weight percent of the colloidal silica abrasive particles.

An eleventh embodiment may include any one of the first through tenth embodiments wherein 30 percent or more of the colloidal silica abrasive particles include three or more aggregated primary particles.

A twelfth embodiment may include any one of the first through tenth embodiments wherein 50 percent or more of the colloidal silica abrasive particles include three or more aggregated primary particles and 20 percent or more of the colloidal silica abrasive particles are monomers or dimers.

A thirteenth embodiment may include any one of the first through twelfth embodiments wherein the colloidal silica abrasive particles include primary particles and 95 percent or more of the primary particles have a primary particle size in a range from 15 to 35 nm.

A fourteenth embodiment may include any one of the first through thirteenth embodiments wherein a molar ratio of the aminosilane compound to silica in the colloidal silica abrasive particles is less than 10 percent.

A fifteenth embodiment may include the fourteenth embodiment wherein the molar ratio is less than 5 percent.

A sixteenth embodiment may include any one of the first through fifteenth embodiments further comprising an alkali catalyst incorporated in the colloidal silica abrasive particles internal to the outer surface thereof.

A seventeenth embodiment may include the sixteenth embodiment wherein the alkali catalyst has from 1 to 6 carbon atoms.

An eighteenth embodiment may include the sixteenth embodiment wherein the alkali catalyst is tetramethylammonium hydroxide or ethyloxypropylamine.

A nineteenth embodiment may include any one of the first through eighteenth embodiments wherein the aminosilane compound comprises a propyl group, primary amine, or quaternary amine.

A twentieth embodiment may include any one of the first through eighteenth embodiments wherein the aminosilane compound comprises bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, (N-trialkoxysilylpropyl)polyethyleneimine, trialkoxysilylpropyldiethylenetriamine, N-phenyl-3-aminopropyltrialkoxysilane, N-(vinylbenzyl)-2-aminoethyl-3-aminopropyltrialkoxysilane, 4-aminobutyltrialkoxysilane, or a mixture thereof.

A twenty-first embodiment may include any one of the first through twentieth embodiments wherein the colloidal silica abrasive particles have a core-shell structure in which an outer shell is disposed over an inner core, the aminosilane compound or the phosphonium silane compound being incorporated in the outer shell.

A twenty-second embodiment may include the twenty-first embodiment wherein the outer shell has a thickness of at least 1 nm.

A twenty-third embodiment may include any one of the first through twenty-second embodiments having an electrical conductivity of less than about 300 μS/cm.

A twenty-fourth embodiment may include any one of the first through twenty-third embodiments wherein the colloidal silica has a density of greater than 1.90 g/cm$^3$.

A twenty-fifth embodiment may include the first embodiment wherein: the colloidal silica abrasive particles have a positive charge of at least 13 mV; the composition has a pH in a range from about 3.5 to about 6; 30 percent or more of the colloidal silica abrasive particles include three or more aggregated primary particles; and the composition includes from about 0.5 to about 4 weight percent of the colloidal silica abrasive particles.

A twenty-sixth embodiment may include the first embodiment wherein: the colloidal silica abrasive particles have a positive charge of at least 13 mV; the composition further includes a buffering agent having a pKa in a range from about 3.5 to about 5.5; the colloidal silica abrasive particles have a mean particle size in a range from about 30 to about 70 nm; the composition includes less than about 3 weight percent of the colloidal silica abrasive particles; and the aminosilane compound comprises a propyl group.

A twenty-seventh embodiment may include the first embodiment wherein: the colloidal silica abrasive particles have a positive charge of at least 13 mV; the composition further includes a buffering agent having a pKa in a range from about 3.5 to about 5.5; 30 percent or more of the colloidal silica abrasive particles include three or more aggregated primary particles; the composition includes less than about 3 weight percent of the colloidal silica abrasive particles; the colloidal silica has a density of greater than 1.90 g/cm$^3$; and the aminosilane compound comprises a propyl group.

A twenty-eighth embodiment may include the first embodiment wherein: the colloidal silica abrasive particles have a positive charge of at least 15 mV; the composition has a pH in a range from about 3.5 to about 6; and the composition has an electrical conductivity of less than about 300 μS/cm.

A twenty-ninth embodiment may include the first embodiment wherein: the colloidal silica abrasive particles have a positive charge of at least 15 mV; 30 percent or more of the colloidal silica abrasive particles include three or more aggregated primary particles; and the colloidal silica abrasive particles include primary particles and 95 percent or more of the primary particles have a primary particle size in a range from 15 to 35 nm.

A thirtieth embodiment may include any one of the first through twenty-ninth embodiments further comprising a silicon nitrogen polishing accelerator including a polycarboxylic acid, a poly phosphonic acid, or a mixture thereof.

A thirty-first embodiment may include the thirtieth embodiment wherein the polycarboxylic acid comprises oxalic acid, malonic acid, succinic acid, glutaric acid, adipic acid, citric acid, tartaric acid, phthalic acid, sulfosuccinic acid, or a mixture thereof.

A thirty-second embodiment may include one of the thirtieth and thirty-first embodiments wherein the poly phosphonic acid comprises a diphosphonic acid compound or a methylene phosphonic acid compound.

A thirty-third embodiment may include any one of the first through thirty-second embodiments further comprising a silicon nitrogen polishing inhibitor having a ring and a nitrogen atom in or bonded to the ring.

A thirty-fourth embodiment may include the thirty-third embodiment wherein the inhibitor further comprises a hydroxy group bonded to the ring.

A first method of chemical-mechanical polishing a substrate including a silicon oxygen material includes: (a) contacting the substrate with the chemical-mechanical polishing composition of any one of claims 1-34; (b) moving the polishing composition relative to the substrate; and (c) abrading the substrate to remove a portion of the silicon oxygen containing material from the substrate and thereby polish the substrate.

A second method may include the first method wherein: the polishing composition has a pH of less than 6 and comprises less than 4 percent by weight of the colloidal silica abrasive particles; and an average removal rate of the silicon oxygen material in (c) is greater than 3000 Å/min at a downforce of 5 psi or less.

A third method may include one of the first and second methods wherein: the polishing composition has a pH of less than 6 and comprises less than 2 percent by weight of the colloidal silica abrasive particles; and an average removal rate of the silicon oxygen material in (c) is greater than 3000 Å/min at a downforce of 5 psi or less.

A fourth method may include any one of the first through third methods wherein: the polishing composition has a pH of less than 6 and comprises less than 3 percent by weight of the colloidal silica abrasive particles; and an average removal rate of the silicon oxygen material in (c) is greater than 2000 Å/min at a downforce of 4 psi or less.

A fifth method may include any one of the first through fourth methods wherein: the polishing composition has a pH of less than 6 and comprises less than 2.0 percent by weight of the colloidal silica abrasive particles; and an average removal rate of the silicon oxygen material in (c) is greater than 2000 Å/min at a downforce of 4 psi or less.

A sixth method may include any one of the first through fifth methods wherein: the polishing composition has a pH in a range from about 3.5 to about 5.5 and comprises less than 2.5 percent by weight of the colloidal silica abrasive particles; and a removal rate of the silicon oxygen material in (c) is greater than 3000 Amin at a downforce of 5 psi or less.

A seventh method may include any one of the first through sixth methods wherein: the polishing composition has a pH in a range from about 3.5 to about 5.5 and comprises less than 2.5 percent by weight of the colloidal silica abrasive particles; and a removal rate of the silicon oxygen material in (c) is greater than 2000 Å/min at a down force of 4 psi or less and a removal rate of a silicon nitride material is less than 300 Å/min at a downforce of 3 psi or less.

An eighth method may include any one of the first through sixth methods wherein the polishing composition further comprises a silicon nitrogen polishing accelerator and a TEOS:SiN polishing rate selectivity is less than about 10:1.

A ninth method may include any one of the first through seventh methods wherein the polishing composition further comprises a silicon nitrogen polishing inhibitor and a TEOS:SiN polishing rate selectivity is greater than about 25:1.

A tenth method may include any one of the first through eighth methods wherein the polishing composition further comprises a silicon nitrogen polishing accelerator and has a pH in a range from about 3 to about 7; and a removal rate of the silicon oxygen material in (c) is greater than 2000 Å/min at a down force of 4 psi or less and a removal rate of a silicon nitride material is greater than 200 Å/min at a downforce of 4 psi or less.

The following examples further illustrate the invention but, of course, should not be construed as in any way limiting its scope. In these examples, reported zeta potentials values were measured using the Model DT-1202 Acoustic and Electroacoustic spectrometer (available from Dispersion Technologies) and reported particles size values were measured using the Zetasizer® available from Malvern Instruments®.

Example 1

The silicon oxide (TEOS) polishing rate was evaluated in this example for various polishing compositions. This example demonstrates that high removal rates can be achieved using polishing compositions having low concentrations of colloidal silica abrasive particles. Each of the polishing compositions included colloidal silica abrasive particles having a core shell structure in which a hydrolyzed or partially hydrolyzed aminopropyl trialkoxysilane (an aminosilane) was incorporated in the shell using a procedure similar to that described below in Example 13. The colloidal silica abrasive particles had a mean particle size of 54 nm. Four polishing compositions were prepared. These compositions included 0.5 wt % of the colloidal silica (1A), 1.0 wt % of the colloidal silica (1B), 2.0 wt % of the colloidal silica (1C), and 3.0 wt % of the colloidal silica (1D). In each polishing composition the pH was adjusted to and buffered at a value of 4.7 using acetic acid. The TEOS polishing rates were obtained by polishing 200 mm (about 8 inch) diameter wafers having a TEOS layer using a Mirra® CMP tool (available from Applied Materials) and an IC1010 polishing pad at down-forces of 4.0 and 5.0 psi, a platen speed of 100 rpm, and a slurry flow rate of 150 ml/min. Table 1 shows the obtained TEOS polishing rates for polishing compositions 1A, 1B, 1C, and 1D as well as a Semisperse® SS25 control composition (which is available from Cabot Microelectronics Corporation, Aurora, Ill.).

TABLE 1

| Polishing Composition | Solids (percent) | Down-force (psi) | TEOS Polishing Rate (Å/min) |
| --- | --- | --- | --- |
| 1A | 0.5 | 4 | 1350 |
|  | 0.5 | 5 | 900 |
| 1B | 1 | 4 | 2300 |
|  | 1 | 5 | 2500 |
| 1C | 2 | 4 | 2800 |
|  | 2 | 5 | 3700 |
| 1D | 3 | 4 | 2950 |
|  | 3 | 5 | 4050 |
| Control | 12.5 | 5 | 4100 |

As is apparent from the results set forth in Table 1, high TEOS removal rates can be achieved using polishing compositions having very low concentrations of colloidal silica abrasive particles in which the particles include an aminosilane incorporated therein. For example, at 2 weight percent colloidal silica, the TEOS removal rate was 2800 Å/min at a downforce of 4 psi and 3700 Å/min at a downforce of 5 psi. At both 2 and 3 weight percent colloidal silica the TEOS removal rates were nearly equal to that control (which included a fumed silica concentration of about 12.5 weight percent).

Example 2

The silicon oxide (TEOS) polishing rate was evaluated in this example for various polishing compositions. This example evaluates the effect of various nitrogen-containing chemical compounds incorporated in the colloidal silica particles. Each of the inventive polishing compositions included colloidal silica abrasive particles grown in a liquid including a nitrogen-containing chemical compound such that the nitrogen-containing compound (or a hydrolyzed or partially hydrolyzed version thereof) was incorporated in the particles. The nitrogen-containing chemical compounds included 3-ethyloxypropylamine (compositions 2A and 2B), tetramethyl ammonium hydroxide (TMAH) (compositions 2C and 2D), and ethylenediamine (compositions 2E and 2F). The colloidal silica particles were grown using a Stöber process in which the nitrogen-containing chemical compounds were employed as a tetramethyl orthosilicate (TMOS) hydrolysis catalyst. Minimal catalyst was added so that the pH became acidic during synthesis causing controlled aggregation such that 30 percent of the colloidal silica abrasive particles had three or more primary particles. The nitrogen content of each of the colloidal silicas was measured by dissolving the colloidal silica in KOH and measuring the nitrogen species by ion chromatography. Each polishing composition included 3 weight percent of the corresponding colloidal silica and was adjusted to a pH of 3.5 using nitric acid.

The TEOS polishing rates were obtained by polishing 300 mm (about 12 inch) diameter wafers having a TEOS layer using a Reflexion® CMP tool (available from Applied Materials) and an IC1010 polishing pad at down-forces of 3.0 and 5.0 psi, a platen speed of 93 rpm, and a slurry flow rate of 250 ml/min. Table 2 shows the nitrogen level in the dry colloidal silica particle, the mean particle size, the zeta potential, and the TEOS polishing rates for polishing compositions 2A through 2F. Data from first and second comparative compositions (controls 1, 2 and 3) are also tabulated. Control 1 included the aforementioned Semisperse® SS25 (at 12.5 weight percent colloidal silica). Control 2 included a 69 nm colloidal Stöber silica having 3-(aminopropyl)trimethoxylsilane associated with the particle surface. The composition included 3 weight percent of the colloidal silica adjusted to a pH of 4.6 using acetic acid. Control 3 included two weight percent of the Nalco 1034A (manufactured using a silicate process) colloidal silica adjusted to pH 4.

TABLE 2

| Polishing Composition | Nitrogen Level (mmol/g $SiO_2$) | Conductivity (μs/cm) | Particle Size (nm) | Zeta Potential (mV) | 3 psi TEOS Rate (Å/min) | 5 psi TEOS Rate (Å/min) |
| --- | --- | --- | --- | --- | --- | --- |
| 2A | 0.19 | 190 | 49 | 8 | 3250 | 4030 |
| 2B | 0.21 | 288 | 48 | 12 | 2990 | 3900 |
| 2C | 0.18 | 214 | 48 | 17 | 2900 | 4430 |
| 2D | 0.20 | 217 | 48 | 18 | 2860 | 3940 |
| 2E |  | 439 | 53 | 4 | 1690 | 2890 |
| 2F |  | 528 | 57 | 4 | 1680 | 1130 |
| Control 1 | <0.02 | 4127 | 140 | −40 | 2760 | 4100 |
| Control 2 |  |  | 69 | 29 |  | 1620 |
| Control 3 | <0.02 |  | 25 | −14 | 39* | NA |

*200 mm wafers polished at 3.5 psi downforce and 65 rpm platen speed on Applied Mirra ®

As is apparent from the results set forth in Table 2, high TEOS removal rates can be achieved using polishing compositions having 3 weight percent colloidal silica abrasive particles in which the particles include EOPA, TMAH, or ethylenediamine incorporated therein. For example, the polishing compositions including colloidal silica with incorporated EOPA (2A and 2B) or TMAH (2C and 2D) exhibited polishing rates comparable to that of Control 1 and significantly greater than Controls 2 and 3.

Example 3

The silicon oxide (TEOS) polishing rate was evaluated in this example for various polishing compositions. This example demonstrates the effect pH on the TEOS polishing rate. Each of the polishing compositions included colloidal silica abrasive particles having a core shell structure in which a hydrolyzed or partially hydrolyzed aminopropyl trialkoxysilane was incorporated in the shell using a procedure similar to that described below in Example 13. The colloidal silica abrasive particles had a mean particle size of 54 nm. Polishing compositions having a colloidal silica concentration of 3 weight percent were prepared at pH values of 2.5 (3A), 3.0 (3B), 3.5 (3C), 4.0 (3D), 4.6 (3E) 4.9 (3F), 5.8 (3G), 8.4 (3H), 9.0 (3I), 10.0 (3J), and 11.0 (3K). Acid was added to polishing compositions 3A through 3G (nitric acid for 3A-3E and 3G and acetic for 3F) and potassium hydroxide was added to polishing compositions 3I through 3K to adjust the pH. The pH of polishing composition 3H was not adjusted (the natural pH was 8.4). The TEOS polishing rates were obtained by polishing 200 mm diameter wafers having a TEOS layer using a Mirra® CMP tool and an IC1010 polishing pad at down-forces of 2.0 and 4.0 psi, a platen speed of 100 rpm, and a slurry flow rate of 150 ml/min. The electrical conductivity of each composition was also measured. Table 3 shows the obtained TEOS polishing rates, the zeta potential, and the electrical conductivity for each of the polishing compositions (3A through 3K).

TABLE 3

| Polishing Composition | pH | Conductivity (µS) | Zeta Potential (mV) | 2 psi TEOS Rate (Å/min) | 4 psi TEOS Rate (Å/min) |
|---|---|---|---|---|---|
| 3A | 2.5 | 1618 | 34 | 130 | 130 |
| 3B | 3.0 | 580 | 36 | 240 | 230 |
| 3C | 3.5 | 301 | 36 | 1100 | 1000 |
| 3D | 4.0 | 171 | 33 | 1680 | 2800 |
| 3E | 4.6 | 120 | 28 | 1660 | 2950 |
| 3F | 4.9 | 89 | 25 | 1720 | 2950 |
| 3G | 5.8 | 96 | 8 | 1670 | 2100 |
| 3H | 8.4 | 22 | −51 | 30 | 200 |
| 3I | 9.0 | 50 | −50 | 30 | 60 |
| 3J | 10.0 | 248 | −38 | 30 | 80 |
| 3K | 11.0 | 994 | −34 | 80 | 160 |

As is apparent from the results set forth in Table 3, high TEOS removal rates were achieved at pH values greater than about 3 and less than about 8 (with a dramatic drop off in TEOS removal rate when the pH values were 3.0 and below and 8.4 and above).

Example 4

The silicon oxide (TEOS) polishing rate was evaluated in this example for various polishing compositions. This example demonstrates the effect of the colloidal silica particle size and colloidal silica concentration on the TEOS polishing rate. Each of the polishing compositions included colloidal silica abrasive particles having a core shell structure in which a hydrolyzed or partially hydrolyzed aminopropyl trialkoxysilane was incorporated in the shell using a procedure similar to that described below in Example 13. Each polishing compositions included two weight percent of the colloidal silica and was adjusted to a pH of 4.7 using acetic acid. Standard Stöber aggregation parameters (time and pH) were adjusted to tune the size of the core particles. The colloidal silica shell was grown following the procedure described in Example 13. The mean particle size of each of the colloidal silicas was measured using a Zetasizer® available from Malvern Instruments®. The mean particle size of the colloidal silica in polishing compositions 4A through 4G ranged from about 30 to about 60 nm. Polishing composition 4A included 30 nm spherical particles, while polishing compositions 4B-4G included aggregated particles. The TEOS polishing rates were obtained by polishing 200 mm diameter wafers having a TEOS layer using a Mirra® CMP tool and an IC1010 polishing pad at down-forces of 4.0, 5.0, and 6.0 psi, a platen speed of 100 rpm, and a slurry flow rate of 150 ml/min. Table 4 shows the mean colloidal silica abrasive particle size and the TEOS polishing rates at the indicated down forces for each of the polishing compositions (4A through 4G).

TABLE 4

| Polishing Composition | Particle Size (nm) | TEOS Rate 4-psi (Å/min) | TEOS Rate 5-psi (Å/min) | TEOS Rate 6-psi (Å/min) |
|---|---|---|---|---|
| 4A | 30 | 1380 | 1570 | 1820 |
| 4B | 43 | 2630 | 3160 | 3620 |
| 4C | 48 | 2670 | 3140 | 3640 |
| 4D | 51 | 2660 | 3200 | 3590 |
| 4E | 54 | 2720 | 3240 | 3160 |
| 4F | 58 | 2780 | 3270 | 1470 |
| 4G | 60 | 2600 | 1820 | 530 |

As is apparent from the results set forth in Table 4, very high TEOS removal rates were obtained over a mean particle size range from about 40 to about 60 nm for polishing compositions including 2 weight percent colloidal silica. The TEOS removal rates were also high even for the 30 nm spherical particles (e.g., as compared to Control 3 in Table 2). The TEOS rates were also lower for the larger particles (e.g., 60 nm) at high down force (6 psi).

Example 5

The silicon oxide (TEOS) polishing rate was evaluated in this example for various polishing compositions. This example also demonstrates the effect of the colloidal silica particle size and colloidal silica concentration on the TEOS polishing rate. Each of the polishing compositions included colloidal silica abrasive particles having a core shell structure in which a hydrolyzed or partially hydrolyzed aminopropyl trialkoxysilane was incorporated in the shell using a procedure similar to that described below in Example 13. Each polishing compositions included three weight percent of the colloidal silica and was adjusted to a pH of 4.7 using acetic acid. Standard Stöber aggregation parameters (time and pH) were adjusted to tune the size of the core particles. The colloidal silica shell was grown following the procedure described in Example 13. The mean particle size for each of the colloidal silicas was measured using a Zetasizer® available from Malvern Instruments®. The mean particle size of the colloidal silica used in polishing compositions 5A through 4H ranged from about 43 to about 105 nm. The TEOS polishing rates were obtained by polishing 200 mm diameter wafers having a TEOS layer using a Mirra® CMP tool and an IC1010 polishing pad at a down force of 5.0 psi, a platen speed of 100 rpm, and a slurry flow rate of 150 ml/min. Table 5 shows the mean colloidal silica abrasive particle size and the TEOS polishing rates for each of the polishing compositions (5A through 5H).

TABLE 5

| Polishing Composition | Particle Size (nm) | TEOS Rate 5-psi (Å/min) |
|---|---|---|
| 5A | 43 | 3840 |
| 5B | 53 | 3900 |
| 5C | 54 | 4040 |
| 5D | 61 | 4070 |
| 5E | 66 | 4100 |
| 5F | 80 | 4160 |
| 5G | 89 | 4190 |
| 5H | 105 | 4210 |

As is apparent from the results set forth in Table 5, high TEOS removal rates were obtained over a mean particle size range from about 43 to about 105 nm for polishing compositions including 3 weight percent colloidal silica. Comparing Examples 4 and 5, the TEOS removal rates were observed to remain high for large particles at the higher colloidal silica concentration (3 vs. 2 weight percent).

Example 6

The silicon oxide (TEOS) polishing rate was evaluated in this example for various polishing compositions. This example also demonstrates the effect of the colloidal silica particle size and colloidal silica concentration on the TEOS polishing rate. Each of polishing compositions 6A-6F included colloidal silica abrasive particles (CSA) having a core shell structure in which a hydrolyzed or partially hydrolyzed aminopropyl trialkoxysilane was incorporated in the shell using a procedure similar to that described below in Example 13. Each of polishing compositions 6G-6L included colloidal silica abrasive particles (CSB) grown in a liquid including TMAH such that the TMAH was incorporated in the particles using a procedure similar to that described above in Example 2 for polishing compositions 2C and 2D. Polishing compositions 6A-6L included 3 weight percent of the corresponding silica particles. The pH of each composition was adjusted using nitric acid. The ingredients of polishing compositions 6A-6L are listed below in Table 6A.

TABLE 6A

| Polishing Composition | Ingredients |
|---|---|
| 6A | 2 wt. % CSA, pH 4.8 |
| 6B | 2 wt. % CSA + 3 mM glutamic acid, pH 4.8 |
| 6C | 2 wt. % CSA + 3 mM Dequest 2010, pH 4.3 |
| 6D | 2 wt. % CSA + 3 mM Dequest 2010, pH 4.8 |
| 6E | 2 wt. % CSA + 3 mM Dequest 2010, pH 4.3 + $KNO_3$ |
| 6F | 2 wt. % CSA + $KNO_3$, pH 4.8 |
| 6G | 3 wt. % CSB, pH 4.0 |
| 6H | 3 wt. % CSB, pH 3.0 |
| 6I | 3 wt. % CSB + 1 mM $KSO_4$, pH 4.1 |
| 6J | 3 wt. % CSB + 1 mM $KSO_4$, pH 3.5 |
| 6K | 3 wt. % CSB + 1 mM $KSO_4$, pH 3.0 |
| 6L | 3 wt. % CSB + 5 mM $KSO_4$, pH 4.1 |

The TEOS polishing rates for polishing compositions 6A-6F were obtained by polishing 200 mm diameter wafers having a TEOS layer using a Mirra® CMP tool and an IC1010 polishing pad at a down force of 2.0 and 4.0 psi, a platen speed of 100 rpm, and a slurry flow rate of 150 ml/min. The TEOS polishing rates for polishing compositions 6G-6L were obtained by polishing 300 mm diameter wafers having a TEOS layer using a Reflexion® CMP tool and an IC1010 polishing pad at downforce of 4.0 psi, a platen speed of 93 rpm and a slurry flow rate of 250 ml/min. Table 6B shows the electrical conductivity, the zeta potential and the TEOS polishing rates for each of the polishing compositions (6A through 6L).

TABLE 6B

| Polishing Composition | Conductivity (μS/cm) | Zeta Potential (mv) | TEOS Rate 2 psi (Å/min) | TEOS Rate 4 psi (Å/min) | SiN Rate 4 psi (Å/min) |
|---|---|---|---|---|---|
| 6A | 82 | 27 | 1580 | 2910 | |
| 6B | 324 | 22 | 1600 | 2710 | |
| 6C | 745 | 12 | 1300 | 2070 | |
| 6D | 826 | 10 | 1370 | 2170 | |
| 6E | 831 | 12 | 1270 | 1980 | |
| 6F | 836 | 24 | 1350 | 1960 | |
| 6G | 84 | 16 | | 3280 | 150 |
| 6H | 583 | 18 | | 1950 | 60 |
| 6I | 321 | 8 | | 2730 | 190 |
| 6J | 407 | 11 | | 2820 | 250 |
| 6K | 661 | 12 | | 1760 | 60 |
| 6L | 3220 | 4 | | 1110 | 270 |

As is apparent from the results set forth in Table 6B, high TEOS removal rates were obtained for polishing compositions having a low electrical conductivity (e.g., less than about 600 μS/cm). The TEOS removal rates were highest for the polishing compositions having the lowest conductivity (6A and 6G).

Example 7

The polishing rates of silicon oxide (TEOS) and silicon nitride (SiN) were evaluated in this example for various polishing compositions. This example demonstrates the effect of phosphonic acid concentration on the TEOS and SiN polishing rates. Each of polishing compositions 7A-7E included colloidal silica abrasive particles having a core shell structure in which a hydrolyzed or partially hydrolyzed aminopropyl trialkoxysilane was incorporated in the shell using a procedure similar to that described below in Example 13. Each composition included 2 weight percent of the colloidal silica particles having a mean particle size of 54 nm. Each composition further included 80 ppm of an acetic acid buffer and an isothiazolinone biocide. Polishing compositions 7B-7E further included a phosphonic acid additive (1-hydroxyethylidene 1-1 diphosphonic acid which is available as Dequest® 2010 from Italmatch Chemicals, Genova, Italy). The pH of each of compositions 7B-7E was adjusted to 4.9 using KOH. The concentration of the phosphonic acid additive, pH, electrical conductivity, and zeta potential of polishing compositions 7A-7E are listed below in Table 7A.

TABLE 7A

| Polishing Composition | Phosphonic Acid Additive (mM) | pH | Conductivity (μS/cm) | Zeta Potential (mv) |
|---|---|---|---|---|
| 7A | 0 | 4.8 | 57 | 29 |
| 7B | 0.25 | 4.9 | 110 | 21 |
| 7C | 0.5 | 4.9 | 177 | 18 |
| 7D | 1.0 | 4.9 | 309 | 15 |
| 7E | 2.0 | 4.9 | 555 | 12 |

The TEOS and SiN polishing rates were obtained by polishing 200 mm diameter wafers having TEOS and SiN layers using a Mirra® CMP tool and an IC1010 polishing pad at down forces of 2.0 and 4.0 psi, a platen speed of 100 rpm, and a slurry flow rate of 150 ml/min. Table 7B shows the TEOS and SiN polishing rates at each downforce for each of the polishing compositions (7A through 7E).

TABLE 7B

| Polishing Composition | TEOS Rate (Å/min) | | SiN Rate (Å/min) | |
|---|---|---|---|---|
| | 2 psi | 4 psi | 2 psi | 4 psi |
| 7A | 1600 | 3100 | 38 | 128 |
| 7B | 1660 | 3120 | 56 | 137 |
| 7C | 1670 | 3060 | 81 | 247 |
| 7D | 1610 | 2880 | 268 | 353 |
| 7E | 1510 | 2510 | 348 | 412 |

As is apparent from the results set forth in Table 7B, increasing the concentration of the phosphonic acid additive (up to 2.0 millimolar) correspondingly increases the SiN polishing rate. The TEOS polishing rate is essentially unaffected up to a concentration of 1.0 mM. At higher concentrations the electrical conductivity of the polishing composition increases and the zeta potential decreases resulting in a corresponding decrease the TEOS polishing rate. Notwithstanding, the TEOS polishing rate remains high (above 2500 Å/min at a downforce of 4 psi) across all compositions.

Example 8

The polishing rates of silicon oxide (TEOS) and silicon nitride (SiN) were evaluated in this example for various polishing compositions. This example demonstrates the effect of various polycarboxylic acids and a polyphosphonic acid additives on the TEOS and SiN polishing rates. Each of polishing compositions 8A-8J included colloidal silica abrasive particles having a core shell structure in which a hydrolyzed or partially hydrolyzed aminopropyl trialkoxysilane was incorporated in the shell using a procedure similar to that described below in Example 13. Each composition included 3 weight percent of the colloidal silica particles. In polishing compositions 8A-8F the colloidal silica had a mean particle size of 41 nm, while in compositions 8G-8J the colloidal silica had a mean particle size of 43 nm. Table 8A lists the concentrations of the polycarboxylic acid and a polyphosphonic acid additives and the pH in each of the polishing compositions.

TABLE 8A

| Polishing Composition | Additive Concentration | pH |
|---|---|---|
| 8A | none | 3.7 |
| 8B | none | 5.2 |
| 8C | 5.0 mM phthalic acid | 3.9 |
| 8D | 5.0 mM phthalic acid | 5.0 |
| 8E | 5.0 mM oxalic acid | 3.8 |
| 8F | 5.0 mM oxalic acid | 4.5 |
| 8G | 3.0 mM citric acid | 5.0 |
| 8H | 5.0 mM citric acid | 4.8 |
| 8I | 3.0 mM sulfosuccinic acid | 4.3 |
| 8J | 3.0 mM Dequest ® 2010 | 3.9 |

The TEOS and SiN polishing rates were obtained by polishing 200 mm diameter wafers having TEOS and SiN layers using a Mirra® CMP tool and an IC1010 polishing pad at a down force of 5.0 psi, a platen speed of 100 rpm, and a slurry flow rate of 150 ml/min. Table 8B shows the zeta potential, the electrical conductivity, the TEOS and SiN polishing rates, and the TEOS:SiN selectivity for each of the polishing compositions (8A through 8J).

TABLE 8B

| Polishing Composition | Zeta Potential (mv) | Conductivity (µS/cm) | TEOS Rate (Å/min) | SiN Rate (Å/min) | TEOS:SiN |
|---|---|---|---|---|---|
| 8A | 36 | 158 | 2730 | 270 | 10:1 |
| 8B | 15 | 99 | 2780 | 150 | 19:1 |
| 8C | 19 | 215 | 2510 | 30 | 84:1 |
| 8D | 6 | 780 | 2480 | 670 | 4:1 |
| 8E | 15 | 881 | 2420 | 310 | 8:1 |
| 8F | 12 | 594 | 2630 | 620 | 4:1 |
| 8G | 8 | 443 | 2730 | 690 | 4:1 |
| 8H | 8 | 687 | 2560 | 770 | 3:1 |
| 8I | 13 | 320 | 2550 | 690 | 4:1 |
| 8J | 14 | 302 | 2640 | 470 | 6:1 |

As is apparent from the results set forth in Table 8B, polycarboxylic acid and polyphosphonic acid additives can significantly increase the SiN polishing rate over a range of pH values. For example, at pH 5, phthalic acid and citric acid additives increased the SiN polishing rate from about 150 to about 700 Å/min. The TEOS polishing rate was largely unchanged (within about 10%). A TEOS:SiN selectivity in a range from about 3:1 to about 8:1 was readily achievable using a number of poly acid additives while simultaneously achieving a high TEOS polishing rate.

Example 9

The polishing rates of silicon oxide (TEOS) and silicon nitride (SiN) were evaluated in this example for various polishing compositions. This example demonstrates the effect of various additives having a ring and/or nitrogen on the TEOS and SiN polishing rates. Each of polishing compositions 9A-9G included colloidal silica abrasive particles having a core shell structure in which a hydrolyzed or partially hydrolyzed aminopropyl trialkoxysilane was incorporated in the shell using a procedure similar to that described below in Example 13. The compositions included either 3 or 2 weight percent of the colloidal silica particles having mean particle sizes 58 and 60 nm. Table 9A lists the concentrations of additives, the pH, and the colloidal silica concentration and mean particle size.

TABLE 9A

| Polishing Composition | Additive Concentration | pH | Colloidal silica | |
|---|---|---|---|---|
| | | | Concentration | Mean size |
| 9A | none | 4.7 | 3 wt. % | 58 nm |
| 9B | 120 ppm acetic acid | 4.6 | 3 wt. % | 58 nm |
| 9C | 2.0 mM aminophenol | 4.6 | 3 wt. % | 58 nm |
| 9D | 2.0 mM aminophenol | 4.6 | 2 wt. % | 60 nm |
| 9E | 4.0 mM aminophenol | 4.6 | 2 wt. % | 60 nm |
| 9F | 2.0 mM hydroxypyridine | 4.6 | 2 wt. % | 60 nm |
| 9G | 4.0 mM hydroxypyridine | 4.6 | 2 wt. % | 60 nm |

The TEOS and SiN polishing rates were obtained by polishing 200 mm diameter wafers having TEOS and SiN layers using a Mirra® CMP tool and an IC1010 polishing pad at a platen speed of 100 rpm, and a slurry flow rate of 150 ml/min. A downforce of 4.0 psi was used for polishing compositions 9A-9C and a downforce of 3.0 psi was used for polishing compositions 9D-9G. Table 9B shows the zeta potential, the electrical conductivity, the TEOS and SiN polishing rates, and the TEOS:SiN selectivity for each of the polishing compositions (9A through 9G).

TABLE 9B

| Polishing Composition | Zeta Potential (mv) | Conductivity (μS/cm) | TEOS Rate (Å/min) | SiN Rate (Å/min) | TEOS:SiN |
|---|---|---|---|---|---|
| 9A | 25 | 82 | 2960 | 370 | 8:1 |
| 9B | 26 | 75 | 2910 | 330 | 9:1 |
| 9C | 26 | 218 | 2720 | 70 | 39:1 |
| 9D | 26 | 197 | 1590 | 30 | 53:1 |
| 9E | 25 | 319 | 1220 | 30 | 41:1 |
| 9F | 26 | 218 | 1730 | 33 | 52:1 |
| 9G | 24 | 355 | 1480 | 33 | 45:1 |

As is apparent from the results set forth in Table 9B, ring containing and/or nitrogen-containing additives can significantly decrease the SiN polishing rate with minimal impact on the TEOS polishing rate. For example, the addition of 2.0 mM aminophenol decreased the SiN polishing rate by about a factor of five resulting in an increase in the TEOS:SiN selectivity from about 10:1 to about 40:1. TEOS:SiN selectivities in the range from about 40:1 to about 50:1 were readily achievable using aminophenol and hydroxypyridine additives.

Example 10

Zeta potential measurements and conductivity measurements were obtained for colloidal silica samples before and after filtration. A 200 ml volume of each composition was filtered through a Millipore Ultracell regenerated cellulose ultrafiltration disk (having a MW cutoff of 100,000 Daltons and a pore size of 6.3 nm). The remaining dispersion (the dispersion that was retained by the ultrafiltration disk) was collected and replenished to the original 200 ml volume using deionized water adjusted to the starting pH of 3 using nitric acid. This procedure was repeated for a total of three ultrafiltration cycles (each of which included an ultrafiltration step and a replenishing step). The zeta-potentials and electrical conductivities of the polishing compositions were measured before and after the ultrafiltration procedure (i.e., for the original polishing composition and the triply ultra-filtered and replenished polishing composition).

Table 10 shows the measured zeta potentials and conductivities for polishing composition 10A and control polishing compositions 10B and 10C. Each polishing composition included 3 weight percent colloidal silica at a pH of 3. Polishing composition 10A included colloidal silica abrasive particles having a core shell structure in which a hydrolyzed or partially hydrolyzed aminopropyl trialkoxysilane was incorporated in the shell using a procedure similar to that described below in Example 13. The particle size was 54 nm. Polishing composition 10B contained a surface treated colloidal silica having 3-(aminopropyl)trimethoxylsilane bonded to the particle surface while polishing composition 10C contained colloidal silica having tetrabutylammonium hydroxide associated with the particle surface. The colloidal silicas used in compositions 10B and 10C had a primary particle size of about 55 nm and an aggregate (secondary) particle size of about 100 nm. As described above, the zeta potentials and electrical conductivities of the original compositions were measured before and after the above described ultrafiltration procedure. Corrected zeta-potential values of the triply ultra-filtered and replenished polishing composition 10B were obtained after adding KCl to correct for ionic strength differences.

TABLE 10

| Polishing Composition | Zeta Potential Before (mV) | Conductivity Before (μs/cm) | Zeta Potential After (mV) | Conductivity After (μs/cm) | Zeta Potential Corrected (mV) |
|---|---|---|---|---|---|
| 10A | 35 | 647 | 39 | 620 | not corrected |
| 10B | 41 | 2130 | 56 | 1156 | 41 |
| 10C | 10 | 1030 | 3 | 1083 | not corrected |

As is apparent from the results set forth in Table 10, the zeta potential of the colloidal silica in polishing compositions 10A is essentially un-changed by filtration indicating that the colloidal silica having an internal aminosilane has a permanent positive charge of about 35-39 mV. The colloidal silica particles treated with 3-(aminopropyl)trimethoxylsilane (10B) were also observed to have a permanent positive charge of about 41 mV while the zeta potential of the colloidal silica particles treated with tetrabutylammonium hydroxide (10C) decreased from 10 to 3 mV indicating that the positive charge was not permanent.

Example 11

The silicon oxide (TEOS) polishing rate was evaluated in this example for various polishing compositions. Each of the polishing compositions included colloidal silica abrasive particles having a core shell structure in which a hydrolyzed or partially hydrolyzed aminopropyl trialkoxysilane was incorporated in the shell using a procedure similar to that described below in Example 13. The colloidal silica abrasive particles used in polishing compositions 11B-11D were coated with additional silicon dioxide as follows: An 1800 gram sample of a stock solution including 20.1 weight percent of the colloidal silica particles having the incorporated aminosilane was prepared for each composition. Tetramethyl orthosilicate was added to the stock solution of a controlled rate of 2.00 ml/min while stirring via syringe pump (46.0 grams to composition 11B, 58.5 grams to composition 11C, and 73.2 gram to composition 11D). Each composition was stirred for an additional 20 minutes and allowed to age for 48 hours at room temperature. The final polishing compositions were prepared by adding 995 grams of the silica-coated abrasive dispersions to a liquid solution containing 8990 grams DI water and 0.80 grams acetic acid to obtain polishing compositions having 2.0 weight percent of the colloidal silica abrasive and a pH of 4.7.

The TEOS polishing rates were obtained by polishing 200 mm diameter wafers having a TEOS layer using a Mirra® CMP tool and an IC1010 polishing pad at down forces of 4.0, 5.0, and 6.0 psi, a platen speed of 100 rpm, and a slurry flow rate of 150 ml/min. Table 11 shows the silica coating thickness, the zeta-potential, and the TEOS polishing rates at each downforce for each of the polishing compositions (11A through 11D).

TABLE 11

| Polishing Composition | Coating Thickness (Å) | Zeta Potential (mV) | TEOS Polishing Rate (Å/min) | | |
|---|---|---|---|---|---|
| | | | 4 psi | 5 psi | 6 psi |
| 11A | 0 | 29 | 2721 | 3148 | 1131 |
| 11B | 2.2 | 27 | 2669 | 3308 | 2375 |
| 11C | 2.8 | 26 | 2640 | 3254 | 2718 |
| 11D | 3.5 | 25 | 2643 | 3243 | 2753 |

As is apparent from the results set forth in Table 11, the silica coating significantly increased the TEOS polishing rates at high down forces (6 PSI).

Example 12

The silicon oxide (TEOS) polishing rate was evaluated in this example for various polishing compositions. Each of the polishing compositions included colloidal silica abrasive particles having a core shell structure in which a hydrolyzed or partially hydrolyzed aminopropyl trialkoxysilane was incorporated in the shell using a procedure similar to that described below in Example 13. Each composition included a blend of a first colloidal silica (having a mean particle size of about 60 nm in which greater than 50% of the aggregates included three or more primary particles) and a second colloidal silica (25 nm primary particles). Each polishing composition included a total colloidal silica concentration of 2.0 weight percent and had a pH of 4.7 (buffered using acetic acid).

The TEOS polishing rates were obtained by polishing 200 mm diameter wafers having a TEOS layer using a Mirra® CMP tool and an IC1010 polishing pad at down forces of 4.0, 5.0, and 6.0 psi, a platen speed of 100 rpm, and a slurry flow rate of 150 ml/min. Table 11 shows the concentrations of the first and second colloidal silicas, the zeta-potential, and the TEOS polishing rates at each downforce for each of the polishing compositions (12A through 12E).

TABLE 12

| Polishing Composition | Colloidal Silica #1 (wt. %) | Colloidal Silica #2 (wt. %) | Zeta Potential (mV) | TEOS Polishing Rate (Å/min) | | |
|---|---|---|---|---|---|---|
| | | | | 4 psi | 5 psi | 6 psi |
| 12A | 2.0 | 0 | 31 | 2721 | 2513 | 1009 |
| 12B | 1.92 | 0.08 | 29 | 2655 | 3291 | 1670 |
| 12C | 1.8 | 0.2 | 28 | 2703 | 3347 | 3052 |
| 12D | 1.6 | 0.4 | 28 | 2592 | 3253 | 3882 |
| 12E | 0 | 2.0 | 25 | 1378 | 1570 | 1812 |

As is apparent from the results set forth in Table 11, the addition of silica monospheres (primary particles) significantly increased the TEOS polishing rates at high down forces (6 psi).

Example 13

A chemical-mechanical polishing composition was prepared as follows. A 2,604 gram quantity of BS-1H colloidal silica dispersion (a 10.5 wt. % colloidal silica dispersion having a mean particle size of about 35 nm available from Fuso Chemical Company, Tokyo, Japan) was added to 5,882 grams of DI water. 3-ethyloxypropylamine (EOPA) was added to the mixture to adjust the pH to 10 and thereby yield a mother liquid. The mother liquid was then heated to 80 degrees C. A mixture of 1872.3 grams of tetramethoxysilane (TMOS) and 16.3 grams of 3-aminopropyltrimethoxysilane (APTMS) (a molar ratio of APTMS:TMOS of 0.007) was added to the mother liquid at a constant rate for a duration of 180 minutes (at a rate of about 10.5 grams per minute) while maintaining the liquid temperature at 80 degrees C. A colloidal silica dispersion including colloidal silica particles having an outer silica shell containing the aminosilane (or a hydrolyzed or partially hydrolyzed aminosilane) was obtained. This colloidal silica dispersion was concentrated to 4,600 milliliters by heating distillation at ordinary pressure. A volume of 3,000 milliliters of DI water was added to the dispersion to replace the methanol (and maintain the volume) during distillation. The final dispersion has a colloidal silica concentration of approximately 20.1 weight percent.

A 3731 gram sample of the final dispersion was added to a liquid mixture including 3.00 grams of acetic acid and 1239 grams of DI water to obtain approximately 5.0 kilograms of a concentrated chemical-mechanical polishing composition having 15 weight percent of the colloidal silica abrasive particles and a pH of 4.7. Point of use chemical-mechanical polishing compositions having 1.0, 2.0, and 3.0 weight percent of the colloidal silica abrasive articles were obtained by diluting the concentrated chemical-mechanical polishing composition with DI water (at a weight ratios of 14:1, 6.5:1, and 4:1 DI water:concentrate).

Example 14

The colloidal silica density was evaluated in this example for various colloidal silica compositions. Five colloidal silicas were evaluated (14A-14E). Colloidal silicas 14A and 14B included PL2 and PL3 colloidal silicas available from Fuso Chemical Company (Tokyo Japan). Colloidal silica 14B further included 3-(aminopropyl)trimethoxylsilane associated with the particle surface. Colloidal silica 14C included colloidal silica abrasive particles having a core shell structure in which a hydrolyzed or partially hydrolyzed aminopropyl trialkoxysilane was incorporated in the shell using a procedure similar to that described above in Example 13. Colloidal silicas 14D and 14E included conventional colloidal silicas grown by processing a high pH silicate solution (e.g., a sodium silicate or potassium silicate solution) so as to protonate the silicate anions and form silicic acid. Colloidal silica 14D included Bindzil® CJ2-2 (available from Akzo Nobel). Colloidal silica 14E included Nalco DVSTS006 (available from Nalco Holding Company).

A sample of each of the above described colloidal silicas 14A-14E was oven dried to obtain corresponding samples of dry silica. A 50 mL Kimble/Kontes KIMAX® glass pycnometer was weighed on a balance (with thermometer and cap on) to obtain a mass of the pycnometer $m_0$. The pycnometer was then filled with 200 proof anhydrous ethanol and weighed again (with thermometer and cap on) to obtain the mass of the full pycnometer $m_e$ (where the mass of the ethanol is given by $m_e$-$m_0$). The ethanol was then partially decanted until about 20 mL remained. A sample (weighing at least 10 mg) of the dry silica was weighed on a balance and then added to the pycnometer (where $m_s$ represents the mass of the dry silica added to the pycnometer). The pycnometer was placed into a vacuum desiccator (with thermometer on and cap off) and kept under vacuum for at least 1.5 hours to remove trapped air in the particle. The pycnometer was then removed from the desiccator, filled with ethanol, and the cap replaced. The pycnometer was wiped dry as necessary. The pycnometer was weighed again to obtain a mass of the pycnometer filled with ethanol and silica $m_{es}$. The volume $V_s$ of the dry silica particles was then calculated using the following equation:

$$V_s = \frac{(m_e - m_0) - (m_{es} - m_s - m_0)}{\rho_e}$$

where $m_0$, $m_e$, $m_s$, and $m_{es}$ represent the measured masses defined above and $\rho_e$ represents the density of ethanol. The density of ethanol is well known and may be obtained at substantially any suitable temperature from various look-up tables or based on the following empirical relation: $-8.461834 \times 10^{-4}$T($°$ C.)$+0.8063372$. The density of the dry silica $\rho_s$ was then calculated using the following equation.

$$\rho_s = \frac{m_s}{V_s}$$

Samples of the dried silica were further mixed with an internal nuclear magnetic resonance standard tetrakis(trimethylsilyl)silane at a 4:1 weight ratio (dry silica:standard). Each of the samples was then measured by solid-state $^{29}$Si{$^1$H} cross-polarization coupled to magic angle spinning (CP-MAS) spectroscopy at 22° C. The experimental details for the $^{29}$Si{$^1$H} CP-MAS NMR measurements were as follows: a 53.8 MHz magnet frequency for the $^{29}$Si nucleus, a spinning rate of 4 kHz, a 90° $^1$H transmitter pulse length of 7 microseconds, an acquisition time of 72 milliseconds, a pulse delay of 3 seconds, a contact time of 5 milliseconds, 10,000 to 20,000 total scans, and a line broadening of 30 Hz. Peaks were referenced to the downfield peak of the standard at $\delta-10$. Peak areas were determined by fitting the spectra to a sum of Gaussian/Lorentzian functions using a non-linear least squares fitting algorithm with the software ACD/Spectrus Processor (available from Advanced Chemistry Development, Inc.) and referenced to the standard peak at $\delta-10$.

Table 14 lists the computed densities and the $^{29}$Si peak areas for the corresponding dry silicas obtained from colloidal silicas 14A-14E.

TABLE 14

| Colloidal Silica | Density (g/cm$^3$) | $^{29}$Si Peak Area |
|---|---|---|
| 14A | 1.87 | 8.76 |
| 14B | 1.78 | 12.32 |
| 14C | 2.09 | 8.50 |
| 14D | 2.14 | 4.36 |
| 14E | 2.16 | 3.55 |

Example 15

The silicon oxide (TEOS) polishing rate was evaluated in this example for various polishing compositions. This example evaluates the effectiveness of various positively charged colloidal silica abrasive particles. Each of the colloidal silica abrasives was fabricated using a common colloidal silica precursor. The colloidal silica precursor had an aggregate distribution in which 20 percent or more of the colloidal silica abrasive particles included less than three primary particles (i.e., non-aggregated primary particles or aggregated particles having just two primary particles, also referred to as monomers and dimers) and 50 percent or more of the colloidal silica abrasive particles included three or more aggregated primary particles. The colloidal silica precursor had a mean particle size of about 47-48 nm as measured by the Malvern® Zetasizer®.

The colloidal silica precursor was prepared using a procedure similar to that described above in Example 13, however, without any addition of an aminosilane to the tetramethoxysilane (i.e., at a molar ratio of APTMS:TMOS equal to zero). The resulting precursor colloidal silica included a low level of an internal nitrogen-containing chemical species (EOPA in this example).

Four types polishing compositions employing positively charged colloidal silica abrasive particles were evaluated in this example:
  (i) Inventive compositions (15A-15C) employing particles having a core-shell structure in which an outer silica layer (the shell) having a thickness of about 2-3 nm was grown over the precursor colloidal silica (the core) in a liquid including aminopropyl trialkoxysilane (APTMS) using a procedure similar to that described above in Example 13 such that a hydrolyzed or partially hydrolyzed aminosilane was incorporated in the shell (compositions 15A, 15B, and 15C in which the molar ratios of APTMS to TMOS were 2.3%, 1.3%, and 0.7%).
  (ii) Inventive compositions (15D-15G) employing a surface treated (bonded) colloidal silica particle in which aminopropyl trialkoxysilane was bonded to a surface of the precursor colloidal silica was prepared by adding varying amounts of 1% APTMS to water. The amount of APTMS was calculated as a percentage of the number of silanols on the surface of 525 g of the precursor particle (105 g SiO$_2$, 110 m$^2$/g BET surface area), assuming 4.5 SiOH/nm$^2$. Four different levels were chosen: 1%, 1.5%, 2%, and 4% (compositions 15D, 15E, 15F, and 15G). The precursor silica dispersion was then added to the water (including the APTMS) and placed in an oven at 45° C. for 48 hours.
  (iii) A composition (15H) employing a surface associated colloidal silica particle in which tetrabutylammonium hydroxide (TBAH) was associated with a surface of the precursor colloidal silica was prepared by adding 600 ppm TBAH to deionized water. The pH was adjusted to 3.5 using nitric acid. The untreated precursor colloidal silica was added to obtain a colloidal silica dispersion having 2.0 weight percent of the colloidal silica and the pH was again adjusted to 3.5 using nitric acid.
  (iv) Control compositions (15I and 15J) were prepared using the untreated precursor colloidal silica.

Each of the polishing compositions included 2.0 weight percent of the respective colloidal particles and 80 ppm by weight acetic acid. The pH was adjusted to the final value using nitric acid or KOH. The mean particles size, pH, and zeta potential of compositions 15A through 15J are shown below in Table 15A.

TABLE 15A

| Polishing Composition | Particle Structure | Treatment Level | pH | Zeta Potential (mV) | Conductivity (μs/cm) | Particle Size (nm) |
|---|---|---|---|---|---|---|
| 15A | Type (i) | 2.3% | 4.3 | 42 | 101 | 55 |
| 15B | Type (i) | 1.3% | 4.3 | 37 | 88 | 56 |
| 15C | Type (i) | 0.7% | 4.3 | 33 | 89 | 54 |
| 15D | Type (ii) | 4.0% | 4.3 | 41 | 94 | 48 |
| 15E | Type (ii) | 2.0% | 4.3 | 35 | 79 | 48 |
| 15F | Type (ii) | 1.5% | 4.3 | 31 | 86 | 47 |
| 15G | Type (ii) | 1.0% | 4.3 | 26 | 92 | 47 |
| 15H | Type (iii) |  | 3.6 | 17 | 437 | 49 |

TABLE 15A-continued

| Polishing Composition | Particle Structure | Treatment Level | pH | Zeta Potential (mV) | Conductivity (µS/cm) | Particle Size (nm) |
|---|---|---|---|---|---|---|
| 15I | Control | None | 3.6 | 10 | 206 | 51 |
| 15J | Control | None | 4.6 | 5 | 51 | 54 |

The TEOS polishing rates were obtained by polishing 200 mm (about 8 inch) diameter wafers having a TEOS layer using a Mirra® CMP tool (available from Applied Materials) and an IC1010 polishing pad at down-forces of 4.0 and 6.0 psi, a platen speed of 100 rpm, and a slurry flow rate of 150 ml/min. Table 15B shows the TEOS polishing rates obtained for polishing compositions 15A-15F.

TABLE 15B

| Polishing Composition | TEOS Polishing Rate (Å/min) | |
|---|---|---|
| | 4 psi | 6 psi |
| 15A | 1590 | 1320 |
| 15B | 2820 | 4190 |
| 15C | 2930 | 4370 |
| 15D | 1970 | 780 |
| 15E | 2900 | 3330 |
| 15F | 2940 | 4150 |
| 15G | 3025 | 4360 |
| 15H | 2470 | 1500 |
| 15I | 2750 | 2260 |
| 15J | 1520 | 600 |

As is apparent from the results set forth in Table 15 very high TEOS polishing rates were achieved for inventive polishing compositions 15B, 15C, 15F and 15G (those employing (i) an internal aminosilane or (ii) internal EOPA and surface bonded aminosilane). Polishing compositions 15A-15G were also observed to have a high zeta potential, with the compositions in which the colloidal silica had an internal aminosilane (15B and 15C) having comparatively higher zeta potentials. For example, compositions 15B and 15F had similar TEOS removal rates, however, composition 15B had a higher zeta potential than composition 15F (37 to 31 mV). Likewise compositions 15C and 15G had similar TEOS removal rates, however, composition 15C had a higher zeta potential than composition 15G (33 to 26 mV). As a result, the polishing compositions utilizing colloidal silica having an internal aminosilane may be expected to have superior shelf life and colloidal stability characteristics and may be expected to provide high TEOS polishing rates at higher pH values than the compositions having a surface treated colloidal silica. Moreover, in this example, polishing compositions utilizing colloidal silica having lower aminosilane levels achieved the highest TEOS polishing rates (e.g., when the molar ratio of aminosilane to silica in the particle was less than 2.3% or when the surface coverage of aminosilane was less than 4% or less than 2%).

Example 16

The colloidal stability and polishing performance were evaluated in this example for six chemical-mechanical polishing concentrates: (i) inventive concentrates including a colloidal silica abrasive with an internal aminosilane (concentrates 16A and 16B) and (ii) inventive concentrates including colloidal silica abrasive particles surface treated with an aminosilane (concentrates 16C, 16D, 16E, and 16F). The colloidal silica in concentrates 16A and 16B was prepared as described above in Example 13. The colloidal silica in concentrates 16C and 16D was prepared as described above for polishing composition 15F in Example 15. The colloidal silica in concentrates 16E and 16F was prepared as described above for polishing composition 15G in Example 15.

Each of the concentrates included 15 weight percent of the respective colloidal silica abrasive particles. Concentrates 16A, 16C, and 16E were adjusted to a pH of 4.6 using acetic acid. Concentrates 16B, 16D, and 16F were adjusted to a pH of 4.9 using acetic acid. Each of the concentrates was aged for one week in an oven at 45 degrees C. The pH, zeta potential, conductivity, and particle size were measured before and after aging and are given in Table 16A.

TABLE 16A

| | As synthesized (time t = 0 days) | | | | Aged (time t = 7 days) | | | |
|---|---|---|---|---|---|---|---|---|
| Concentrate | pH | Zeta Pot (mV) | Cond (µS/cm) | Size (nm) | pH | Zeta Pot (mV) | Cond (µS/cm) | Size (nm) |
| 16A | 4.6 | 19 | 354 | 49 | 4.69 | 18 | 381 | 50 |
| 16B | 4.9 | 17 | 339 | 49 | 5.04 | 14 | 363 | 52 |
| 16C | 4.6 | 18 | 331 | 48 | 4.62 | 17 | 355 | 50 |
| 16D | 4.9 | 16 | 312 | 48 | 5.02 | 14 | 337 | 53 |
| 16E | 4.6 | 14 | 315 | 51 | 4.67 | 15 | 332 | 56 |
| 16F | 4.9 | 13 | 296 | 50 | 4.94 | 14 | 316 | 75 |

Each of the concentrates was also diluted using 9 parts deionized water to one part of the concentrate to obtain corresponding polishing compositions (16A-16F) having 1.5 weight percent of the colloidal silica abrasive particles (corresponding polishing compositions 6A-6F). TEOS polishing rates were obtained for each of the polishing compositions by polishing 200 mm (about 8 inch) diameter wafers having the corresponding layers using a Mirra® CMP tool (available from Applied Materials) and an IC1010 polishing pad. The TEOS wafers were polished at down-forces of 4.0 and 6.0 psi at a platen speed of 100 rpm, and a slurry flow rate of 150 ml/min. The polishing rates are shown in Table 16B. Table 16B further shows the pH, zeta potential, conductivity, and particle size of the dilute polishing compositions.

TABLE 16B

| Polishing Composition | pH | Zeta Pot (mV) | Cond (µS/cm) | Size (nm) | Polishing Rate (Å/min) | |
|---|---|---|---|---|---|---|
| | | | | | TEOS (4 psi) | TEOS (6 psi) |
| 16A | 4.71 | 31 | 46 | 52 | 2990 | 3790 |
| 16B | 4.97 | 27 | 40 | 51 | 2970 | 3140 |
| 16C | 4.67 | 30 | 45 | 49 | 2880 | 2420 |
| 16D | 4.97 | 25 | 38 | 53 | 2650 | 1610 |
| 16E | 4.74 | 24 | 43 | 51 | 2840 | 2070 |
| 16F | 4.94 | 20 | 38 | 52 | 2540 | 1400 |

As is apparent from the results set forth in Table 16A, the mean particle size of the colloidal silica abrasive particles in compositions 16A-16D remains approximately constant after 1 week at 45 degrees C. The mean particle size in compositions 16E and 16F increased modestly, particularly at higher pH (16F). As is further apparent from the results set forth in Table 16B, polishing compositions 16A and 16B demonstrated superior TEOS polishing rates. At a down-force of 6 psi, the TEOS polishing rate for composition 16B was significantly greater than for the corresponding polishing compositions 16D and 16F. It also indicates that the colloidal silica abrasive particles employing an internal aminosilane may be superior in polishing compositions having a higher pH and lower solids loading.

Example 17

The silicon oxide (TEOS) polishing rate was evaluated in this example for a polishing composition including a colloidal silica having an internal aminosilane, but fabricated using an alternative methodology. In this example, colloidal silica particles having a core-shell structure were utilized. A silicate process was used to grow an outer silica layer having a thickness of about 1 nm over a precursor core in a liquid including aminopropyl trialkoxysilane (such that the aminosilane was incorporated in the shell). In composition 17A the precursor silica was the same as in Example 15I. In composition 17B, the precursor silica was Nalco DVSTS006 colloidal silica.

A sodium silicate solution (containing 26.5 wt % silica) was diluted to 6.5 wt % and chilled overnight. The diluted silicate solution was then deionized using a Dowex 650C cationic resin to obtain a dilute silicic acid solution. 550 grams of the silicic acid solution was then separated and placed in an ice bath. The reaction heel was set up as follows: A 250 g sample of stock dispersion was diluted to 3% solids, pH adjusted to 9.5 with 45% KOH, and then heated to 80 degrees C. The stock dispersion included 20 weight percent of the precursor silica described above for compositions 17A and 17B. Separately, a syringe pump was set up with a 1% solution of aminopropyl trialkoxysilane. After the reaction heel had stabilized at 80 degrees C., the silicic acid and aminopropyl trialkoxysilane solutions were fed into the reaction heel using respective peristaltic and syringe pumps. The aminopropyl trialkoxysilane solution was added over a time period of four hours.

After the 4 hours, the addition of the aminopropyl trialkoxysilane solution was terminated. The silicic acid solution was added for an additional 30 minutes. The reaction was stirred for an additional 1 hour at 80 degrees C. and then allowed to cool to room temperature overnight. After cooling, the resulting dispersion was filtered using a 0.5 µm Pall filter to remove aggregates and gel formed during the reaction.

Polishing compositions (compositions 17A and 17B) were prepared including 2.0 weight percent of the colloidal silica particles and 600 ppm by weight acetic acid and had a pH of 4.2. Table 17A shows the zeta potential, particle size, electrical conductivity, potassium level, and total metals level for each of the polishing compositions. Inventive composition 15C (from Example 15) is also shown for comparison.

TABLE 17A

| Polishing Composition | Zeta Potential (mV) | Conductivity (µs/cm) | Particle Size (nm) | Potassium (ppm) | Total Metal (ppm) |
|---|---|---|---|---|---|
| 17A | 24 | 195 | 54 | 32 | 40 |
| 17B | 24 | 285 | 56 | 130 | 137 |
| 15C | 33 | 89 | 54 | <2.5 | <3 |

The TEOS polishing rates was obtained by polishing 200 mm (about 8 inch) diameter wafers having a TEOS layer using a Mirra® CMP tool (available from Applied Materials) and an IC1010 polishing pad at down-forces of 4.0 and 6.0 psi, a platen speed of 100 rpm, and a slurry flow rate of 150 ml/min. The TEOS polishing rates are shown in Table 17B. Inventive composition 15C (from Example 15) is also shown for comparison.

TABLE 17B

| Polishing Composition | TEOS Rate 4 psi (Å/min) | TEOS Rate 6 psi (Å/min) |
|---|---|---|
| 17A | 3060 | 4270 |
| 17B | 1080 | 1420 |
| 15C | 2930 | 4370 |

As is apparent from the results set forth in Table 17 polishing compositions 15B and 17A both exhibit very high TEOS removal rates indicating that the aminosilane may be incorporated into the colloidal silica particles using various colloidal silica growth mechanisms (e.g. Stöber and silicate processes). The data set forth in Table 17 also shows that composition 15B had a higher zeta potential than composition 17A (33 vs 24 mV) and may therefore be expected to have superior shelf life and colloidal stability characteristics. Moreover, these compositions may be expected to provide high TEOS polishing rates at higher pH values than the compositions having a surface treated colloidal silica.

Example 18

The silicon oxide (TEOS) polishing rate was evaluated in this example for various polishing compositions. This example demonstrates that high removal rates can be achieved using polishing compositions having low concentrations of colloidal silica abrasive particles. Each of the polishing compositions included colloidal silica abrasive particles having a core shell structure in which a hydrolyzed or partially hydrolyzed aminopropyl trialkoxysilane was incorporated in the shell using a procedure similar to that described above in Example 13. The colloidal silica abrasive particles had a mean particle size of 54 nm. A single concentrated polishing compositions was prepared having a 15 weight percent of the colloidal silica abrasive particles and a pH of 4.7 (buffered using acetic acid). The concentrated polishing composition further included 0.5 wt % Pluriol 300, 600 ppm by weight acetic acid, and 12 ppm by weight Kathon LX biocide. Samples of the concentrated polishing composition were diluted using deionized water to obtain polishing compositions having 0.5 wt % solids (18A), 1.0 wt % solids (18B), 1.5 wt % solids (18C), 2.0 wt % solids (18D), 2.5 wt % solids (18E), and 3.0 wt % solids (18F).

The TEOS polishing rates were obtained by polishing 200 mm (about 8 inch) diameter wafers having a TEOS layer using a Mirra® CMP tool (available from Applied Materials) and an IC1010 polishing pad at down-forces of 1.5, 3.0, 4.0 and 5.0 psi, a platen speed of 100 rpm, and a slurry flow rate of 150 ml/min. Table 18 shows the dilution ratios (water to concentrate composition ratio) and the obtained TEOS polishing rates for polishing compositions 18A, 18B, 18C, 18D, 18E, and 18F as well as a Semisperse® SS25 control composition having 12.5 wt % solids (which is available from Cabot Microelectronics Corporation, Aurora, Ill.).

TABLE 18

| Polishing Composition | Dilution Ratio | TEOS Polishing Rate (Å/min) | | | |
|---|---|---|---|---|---|
| | | 1.5 psi | 3 psi | 4 psi | 5 psi |
| 18A | 29:1 | 940 | 1400 | 1350 | |
| 18B | 14:1 | 1100 | 2070 | 2560 | 2690 |
| 18C | 9:1 | 1130 | 2260 | 2940 | 3480 |
| 18D | 6.5:1 | 1170 | 2290 | 3140 | 3630 |

TABLE 18-continued

| Polishing Composition | Dilution Ratio | TEOS Polishing Rate (Å/min) | | | |
|---|---|---|---|---|---|
| | | 1.5 psi | 3 psi | 4 psi | 5 psi |
| 18E | 5:1 | 1200 | 2430 | 3190 | 3860 |
| 18F | 4:1 | 1240 | 2480 | | 4030 |
| Control | 1:1 | 1200 | 2260 | 2970 | 3720 |

As is apparent from the results set forth in Table 18, high TEOS removal rates can be achieved using polishing compositions having very low concentrations of colloidal silica abrasive particles in which the particles include an aminosilane incorporated therein. For example, at 2 weight percent colloidal silica, the TEOS removal rate was 3140 Å/min at a downforce of 4 psi and 3630 Å/min at a downforce of 5 psi. At 1.5, 2, 2.5, and 3 weight percent colloidal silica the TEOS removal rates were similar to the control (which included a fumed silica concentration of about 12.5 weight percent). Moreover, at very low downforces a polishing composition having 1 weight percent colloidal silica was nearly equal to the control (1100 vs 1200 Å/min) and a polishing composition having 0.5 weight percent colloidal silica was nearly 80% of the control (940 vs 1200 Å/min).

Example 19

The silicon oxide (TEOS) polishing rate was evaluated in this example for various polishing compositions. This example demonstrates that high removal rates can be achieved using polishing compositions having low concentrations of colloidal silica abrasive particles at near neutral pH values. Each of the polishing compositions included colloidal silica abrasive particles having a core shell structure in which a hydrolyzed or partially hydrolyzed aminopropyl trialkoxysilane was incorporated in the shell using a procedure similar to that described above in Example 13. A stock solution was prepared having 2 wt % of the colloidal silica having a particle size of 48 nm at pH 9. Three polishing compositions were obtained from the stock solution by adjusting the pH to values to 4.8 (composition 19A), 5.3 (composition 19B), and 5.9 (composition 19C) using acetic acid. Polishing compositions 19A, 19B, and 19C included 80, 45, and 25 ppm of acetic acid.

The TEOS polishing rates were obtained by polishing 200 mm (about 8 inch) diameter wafers having a TEOS layer using a Mirra® CMP tool (available from Applied Materials) and an IC1010 polishing pad at down-forces of 4.0 and 6.0 psi, a platen speed of 100 rpm, and a slurry flow rate of 150 ml/min. Table 18 shows pH, the zeta potential, and the TEOS polishing rates for polishing compositions 19A, 19B, and 19C.

TABLE 19

| Polishing Composition | pH | Zeta Potential (mV) | TEOS Rate 4 psi (Å/min) | TEOS Rate 6 psi (Å/min) |
|---|---|---|---|---|
| 19A | 4.8 | 41 | 2510 | 3640 |
| 19B | 5.3 | 35 | 2690 | 3600 |
| 19C | 5.9 | 22 | 2320 | 2550 |

As is apparent from the forth in Table 19, polishing compositions employing a colloidal silica having an internal aminosilane can achieve high TEOS removal rates at pH values up to at least 6.

Example 20

The polishing rates of silicon oxide (TEOS) and silicon nitride (SiN) were evaluated in this example for polishing compositions with particles containing different types of aminosilanes. Polishing composition 20A included colloidal silica abrasive particles grown in a liquid solution including (3-aminopropyl)trimethoxysilane (aminosilane/TMOS molar ratio=0.7%) using a procedure similar to that described above in Example 13 such that a hydrolyzed or partially hydrolyzed aminosilane was incorporated in the particles. Polishing composition 20B included colloidal silica abrasive particles grown in a liquid solution including N-(2-Aminoethyl)-3-aminopropyltrimethoxysilane (aminosilane/TMOS molar ratio=0.7%) using a procedure similar to that described above in Example 13 such that a hydrolyzed or partially hydrolyzed aminosilane was incorporated in the particles. Each of the polishing compositions included 2.0 weight percent of the respective colloidal particles and 80 ppm by weight acetic acid. Table 20 shows the analytical data including pH, particle size, zeta potential, and conductivity of the polishing compositions.

The TEOS and SiN polishing rates were obtained by polishing 200 mm diameter wafers having TEOS and SiN layers using a Mirra® CMP tool and an IC1010 polishing pad at a down force of 4.0 psi (both TEOS and SiN) and 6.0 psi (TEOS only), a platen speed of 100 rpm, and a slurry flow rate of 150 ml/min. Table 20 shows the TEOS and SiN polishing rates.

TABLE 20

| Polishing Composition | pH | Particle Size (nm) | Zeta Potential (mv) | Conductivity (μS/cm) | TEOS Rate (Å/min) | | SiN Rate (Å/min) |
|---|---|---|---|---|---|---|---|
| | | | | | 4 psi | 6 psi | |
| 20A | 4.8 | 58 | 30 | 53 | 3220 | 4420 | 190 |
| 20B | 4.9 | 55 | 27 | 60 | 3140 | 4270 | 210 |

As is apparent from the results set forth in Table 20, abrasive particles modified via different aminosilane compounds have similar properties, as well as similar TEOS and SiN polishing rates.

While the above described examples demonstrate that colloidal silica abrasive particles having an incorporated chemical compound such as a nitrogen-containing compound may be utilized in a CMP composition to polish a silicon oxygen containing material such as TEOS, it will be understood the disclosed embodiments are not so limited. For example, colloidal silica abrasive particles having an incorporated chemical compound may also be utilized in CMP compositions for polishing (i) metal layers including tungsten, aluminum, copper, tantalum, and titanium, (ii) nitride layers including titanium nitride, tantalum nitride, silicon nitride, and tungsten nitride, (iii) other dielectrics including low-k dielectrics, and (iv) other materials including silicon, germanium, and polysilicon. Such CMP compositions may optionally include additional components, for example, including one or more oxidizers, chelating agents, catalysts, accelerators, and the like. The disclosed embodiments are expressly not limited by or to the above described examples.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical mechanical polishing composition comprising:
   a water based liquid carrier;
   colloidal silica abrasive particles dispersed in the liquid carrier;
   an aminosilane compound or a phosphonium silane compound incorporated in the colloidal silica abrasive particles internal to an outer surface thereof; and
   a pH in a range from about 1.5 to about 7.

2. The composition of claim 1, wherein the colloidal silica abrasive particles have a positive charge of at least 13 mV.

3. The composition of claim 1, wherein the colloidal silica abrasive particles have a positive charge of at least 20 mV.

4. The composition of claim 1, wherein the colloidal silica abrasive particles have a positive charge of at least 15 mV and less than 35 mV.

5. The composition of claim 1, having a pH in a range from about 3.5 to about 6.

6. The composition of claim 1, further comprising a buffering agent having a pKa in a range from about 3.5 to about 5.5.

7. The composition of claim 1, wherein the colloidal silica abrasive particles have a mean particle size in a range from about 30 to about 70 nm.

8. The composition of claim 1, wherein the colloidal silica abrasive particles have a mean particle size in a range from about 40 to about 60 nm.

9. The composition of claim 1, comprising from about 0.5 to about 4 weight percent of the colloidal silica abrasive particles.

10. The composition of claim 1, comprising less than about 3 weight percent of the colloidal silica abrasive particles.

11. The composition of claim 1, wherein 30 percent or more of the colloidal silica abrasive particles include three or more aggregated primary particles.

12. The composition of claim 1, wherein 50 percent or more of the colloidal silica abrasive particles include three or more aggregated primary particles and 20 percent or more of the colloidal silica abrasive particles are monomers or dimers.

13. The composition of claim 1, wherein the colloidal silica abrasive particles include primary particles and 95 percent or more of the primary particles have a primary particle size in a range from 15 to 35 nm.

14. The composition of claim 1, wherein a molar ratio of the aminosilane compound to silica in the colloidal silica abrasive particles is less than 10 percent.

15. The composition of claim 14, wherein the molar ratio is less than 5 percent.

16. The composition of claim 1, further comprising an alkali catalyst incorporated in the colloidal silica abrasive particles internal to the outer surface thereof.

17. The composition of claim 16, wherein the alkali catalyst has from 1 to 6 carbon atoms.

18. The composition of claim 16, wherein the alkali catalyst is tetramethylammonium hydroxide or ethyloxypropylamine.

19. The composition of claim 1, wherein the aminosilane compound comprises a propyl group, primary amine, or quaternary amine.

20. The composition of claim 1, wherein the aminosilane compound comprises bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl) propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, (N-trialkoxysilylpropyl)polyethyleneimine, trialkoxysilylpropyldiethylenetriamine, N-phenyl-3-aminopropyltrialkoxysilane, N-(vinylbenzyl)-2-aminoethyl-3-aminopropyltrialkoxysilane, 4-aminobutyltrialkoxysilane, or a mixture thereof.

21. The composition of claim 1, wherein the colloidal silica abrasive particles have a core-shell structure in which an outer shell is disposed over an inner core, the aminosilane compound or the phosphonium silane compound being incorporated in the outer shell.

22. The composition of claim 21, wherein the outer shell has a thickness of at least 1 nm.

23. The composition of claim 1, having an electrical conductivity of less than about 300 µS/cm.

24. The composition of claim 1, wherein the colloidal silica has a density of greater than 1.90 g/cm$^3$.

25. The composition of claim 1, wherein:
   the colloidal silica abrasive particles have a positive charge of at least 13 mV;
   the composition has a pH in a range from about 3.5 to about 6;
   30 percent or more of the colloidal silica abrasive particles include three or more aggregated primary particles; and the composition includes from about 0.5 to about 4 weight percent of the colloidal silica abrasive particles.

26. The composition of claim 1, wherein:
the colloidal silica abrasive particles have a positive charge of at least 13 mV;
the composition further includes a buffering agent having a pKa in a range from about 3.5 to about 5.5;
the colloidal silica abrasive particles have a mean particle size in a range from about 30 to about 70 nm;
the composition includes less than about 3 weight percent of the colloidal silica abrasive particles; and
the aminosilane compound comprises a propyl group.

27. The composition of claim 1, wherein:
the colloidal silica abrasive particles have a positive charge of at least 13 mV;
the composition further includes a buffering agent having a pKa in a range from about 3.5 to about 5.5;
30 percent or more of the colloidal silica abrasive particles include three or more aggregated primary particles;
the composition includes less than about 3 weight percent of the colloidal silica abrasive particles;
the colloidal silica has a density of greater than 1.90 g/cm$^3$; and
the aminosilane compound comprises a propyl group.

28. The composition of claim 1, wherein:
the colloidal silica abrasive particles have a positive charge of at least 15 mV;
the composition has a pH in a range from about 3.5 to about 6; and
the composition has an electrical conductivity of less than about 300 μS/cm.

29. The composition of claim 1, wherein:
the colloidal silica abrasive particles have a positive charge of at least 15 mV;
30 percent or more of the colloidal silica abrasive particles include three or more aggregated primary particles; and
the colloidal silica abrasive particles include primary particles and 95 percent or more of the primary particles have a primary particle size in a range from 15 to 35 nm.

30. The composition of claim 1, further comprising a silicon nitrogen polishing accelerator including a polycarboxylic acid, a poly phosphonic acid, or a mixture thereof.

31. The composition of claim 30, wherein the polycarboxylic acid comprises oxalic acid, malonic acid, succinic acid, glutaric acid, adipic acid, citric acid, tartaric acid, phthalic acid, sulfosuccinic acid, or a mixture thereof.

32. The composition of claim 30, wherein the poly phosphonic acid comprises a diphosphonic acid compound or a methylene phosphonic acid compound.

33. The composition of claim 1, further comprising a silicon nitrogen polishing inhibitor having a ring and a nitrogen atom in or bonded to the ring.

34. The composition of claim 33, wherein the inhibitor further comprises a hydroxy group bonded to the ring.

35. A method of chemical mechanical polishing a substrate including a silicon oxygen material, the method comprising:
(a) contacting the substrate with the chemical mechanical polishing composition of claim 1;
(b) moving the polishing composition relative to the substrate; and
(c) abrading the substrate to remove a portion of the silicon oxygen containing material from the substrate and thereby polish the substrate.

36. The method of claim 35, wherein:
the polishing composition has a pH of less than 6 and comprises less than 4 percent by weight of the colloidal silica abrasive particles; and
an average removal rate of the silicon oxygen material in (c) is greater than 3000 Å/min at a downforce of 5 psi or less.

37. The method of claim 35, wherein:
the polishing composition has a pH of less than 6 and comprises less than 2 percent by weight of the colloidal silica abrasive particles; and
an average removal rate of the silicon oxygen material in (c) is greater than 3000 Å/min at a downforce of 5 psi or less.

38. The method of claim 35, wherein:
the polishing composition has a pH of less than 6 and comprises less than 3 percent by weight of the colloidal silica abrasive particles; and
an average removal rate of the silicon oxygen material in (c) is greater than 2000 Å/min at a downforce of 4 psi or less.

39. The method of claim 35, wherein:
the polishing composition has a pH of less than 6 and comprises less than 2.0 percent by weight of the colloidal silica abrasive particles; and
an average removal rate of the silicon oxygen material in (c) is greater than 2000 Å/min at a downforce of 4 psi or less.

40. The method of claim 35, wherein:
the polishing composition has a pH in a range from about 3.5 to about 5.5 and comprises less than 2.5 percent by weight of the colloidal silica abrasive particles; and
a removal rate of the silicon oxygen material in (c) is greater than 3000 Å/min at a downforce of 5 psi or less.

41. The method of claim 35, wherein:
the polishing composition has a pH in a range from about 3.5 to about 5.5 and comprises less than 2.5 percent by weight of the colloidal silica abrasive particles; and
a removal rate of the silicon oxygen material in (c) is greater than 2000 Å/min at a down force of 4 psi or less and a removal rate of a silicon nitride material is less than 300 Å/min at a downforce of 3 psi or less.

42. The method of claim 35, wherein the polishing composition further comprises a silicon nitrogen polishing accelerator and a TEOS:SiN polishing rate selectivity is less than about 10:1.

43. The method of claim 35, wherein the polishing composition further comprises a silicon nitrogen polishing inhibitor and a TEOS:SiN polishing rate selectivity is greater than about 25:1.

44. The method of claim 35, wherein:
the polishing composition further comprises a silicon nitrogen polishing accelerator and has a pH in a range from about 3 to about 7; and
a removal rate of the silicon oxygen material in (c) is greater than 2000 Å/min at a down force of 4 psi or less and a removal rate of a silicon nitride material is greater than 200 Å/min at a downforce of 4 psi or less.

* * * * *